(12) United States Patent
Kim et al.

(10) Patent No.: US 9,348,164 B2
(45) Date of Patent: May 24, 2016

(54) LIQUID CRYSTAL DISPLAY AND METHOD OF MANUFACTURING THE SAME

(71) Applicant: Samsung Display Co., Ltd., Yongin, Gyeonggi-do (KR)

(72) Inventors: Tae Gyun Kim, Yongin (KR); Woo Yong Sung, Yongin (KR); Tae Woon Cha, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/272,902

(22) Filed: May 8, 2014

(65) Prior Publication Data

US 2015/0116637 A1  Apr. 30, 2015

(30) Foreign Application Priority Data

Oct. 24, 2013 (KR) .................. 10-2013-0127341

(51) Int. Cl.
*G02F 1/1333* (2006.01)
*G02F 1/1341* (2006.01)
*G02F 1/1368* (2006.01)
*H01L 27/12* (2006.01)

(52) U.S. Cl.
CPC ........ *G02F 1/133377* (2013.01); *G02F 1/1341* (2013.01); *G02F 1/1368* (2013.01); *H01L 27/124* (2013.01); *H01L 27/1259* (2013.01); *G02F 2001/13415* (2013.01); *G02F 2001/133368* (2013.01)

(58) Field of Classification Search
CPC ............ G02F 1/133377; G02F 1/1368; G02F 2001/133368; G02F 1/1341; G02F 2001/13415; H01L 27/124; H01L 27/1259
See application file for complete search history.

(56) References Cited

U.S. PATENT DOCUMENTS

| | | | |
|---|---|---|---|
| 5,459,597 | A | 10/1995 | Yamamoto et al. |
| 6,326,225 | B1 | 12/2001 | Yamazaki et al. |
| 8,426,229 | B2 | 4/2013 | Park et al. |
| 2012/0062448 | A1* | 3/2012 | Kim .................. G02F 1/133377 345/55 |

FOREIGN PATENT DOCUMENTS

| | | |
|---|---|---|
| JP | 07-248504 | 9/1995 |
| JP | 07-318955 | 12/1995 |
| JP | 09-258235 | 10/1997 |
| JP | 10-048648 | 2/1998 |
| JP | 11-052398 | 2/1999 |
| JP | 2001-183678 | 7/2001 |
| KR | 10-2000-0051637 | 8/2000 |

* cited by examiner

*Primary Examiner* — Dennis Y Kim
(74) *Attorney, Agent, or Firm* — Knobbe Martens Olson & Bear LLP

(57) ABSTRACT

A liquid crystal display includes: a substrate; a thin film transistor disposed on the substrate; a pixel electrode disposed on the thin film transistor; a roof layer facing the pixel electrode; a plurality of microcavities formed between the pixel electrode and the roof layer, each microcavity including liquid crystal materials; a trench formed between the microcavities; and a buffer region formed at an end portion of the trench.

10 Claims, 30 Drawing Sheets

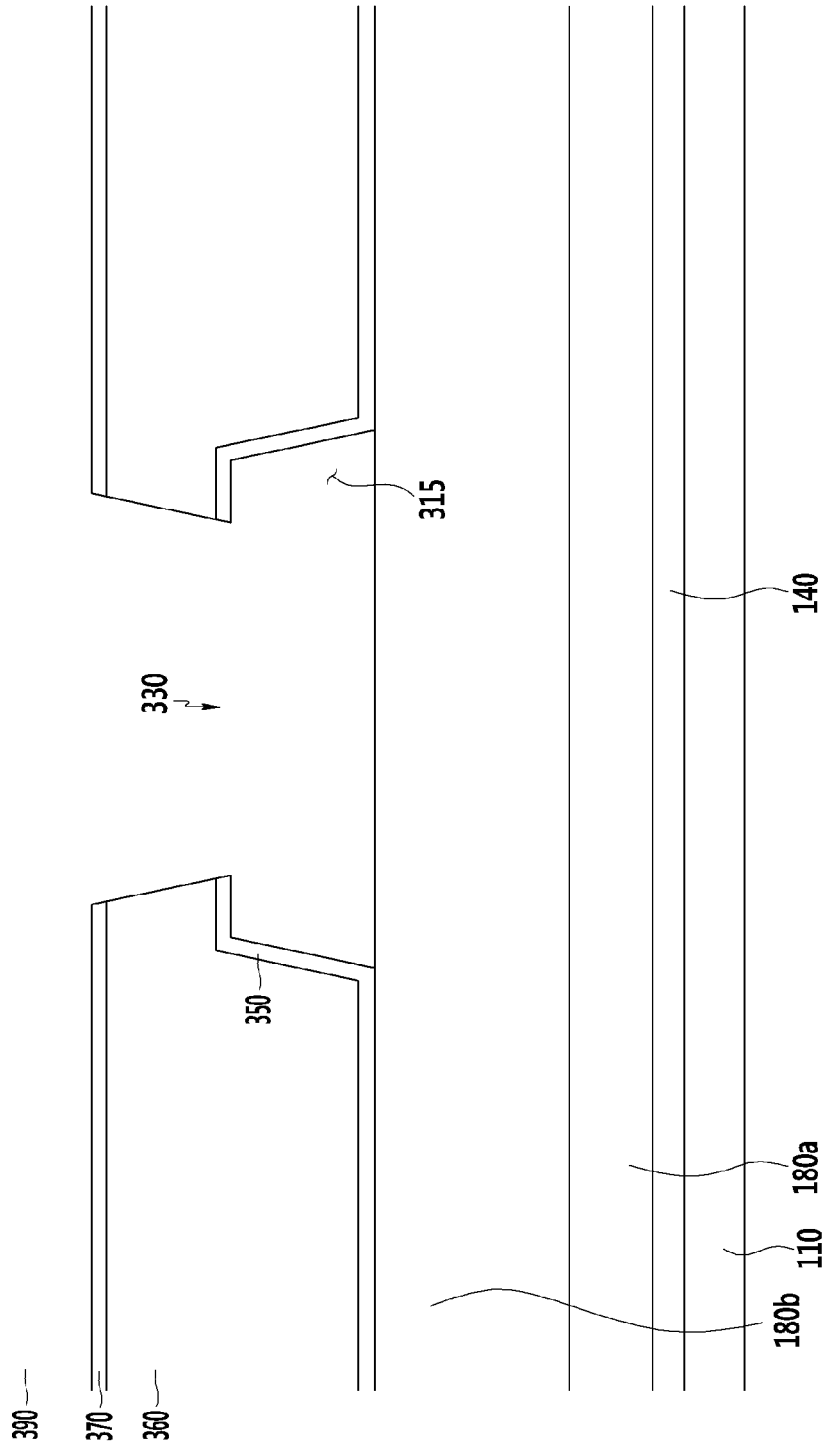

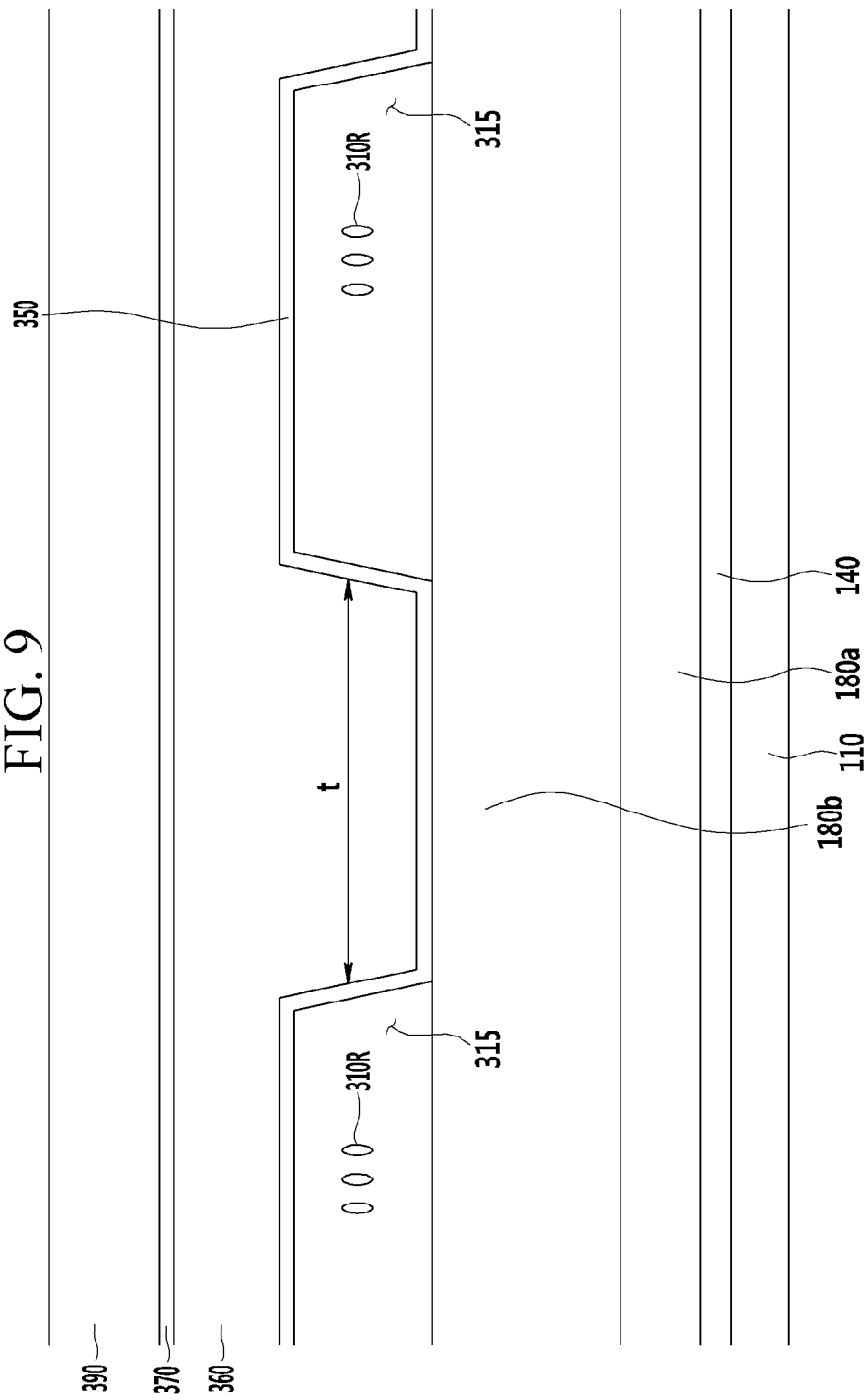

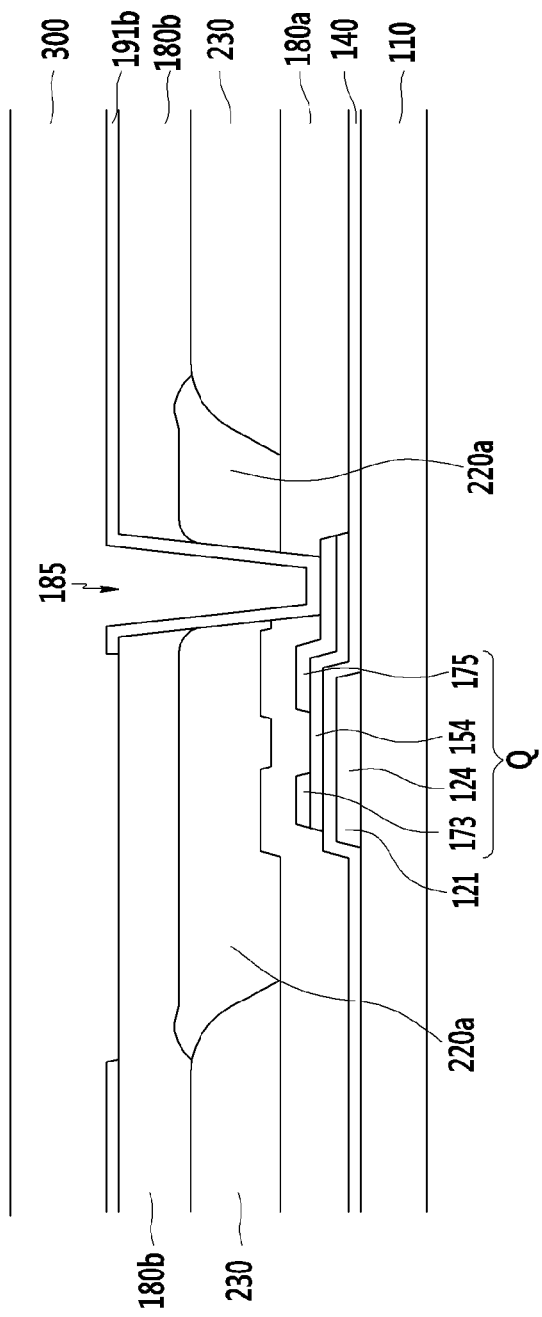

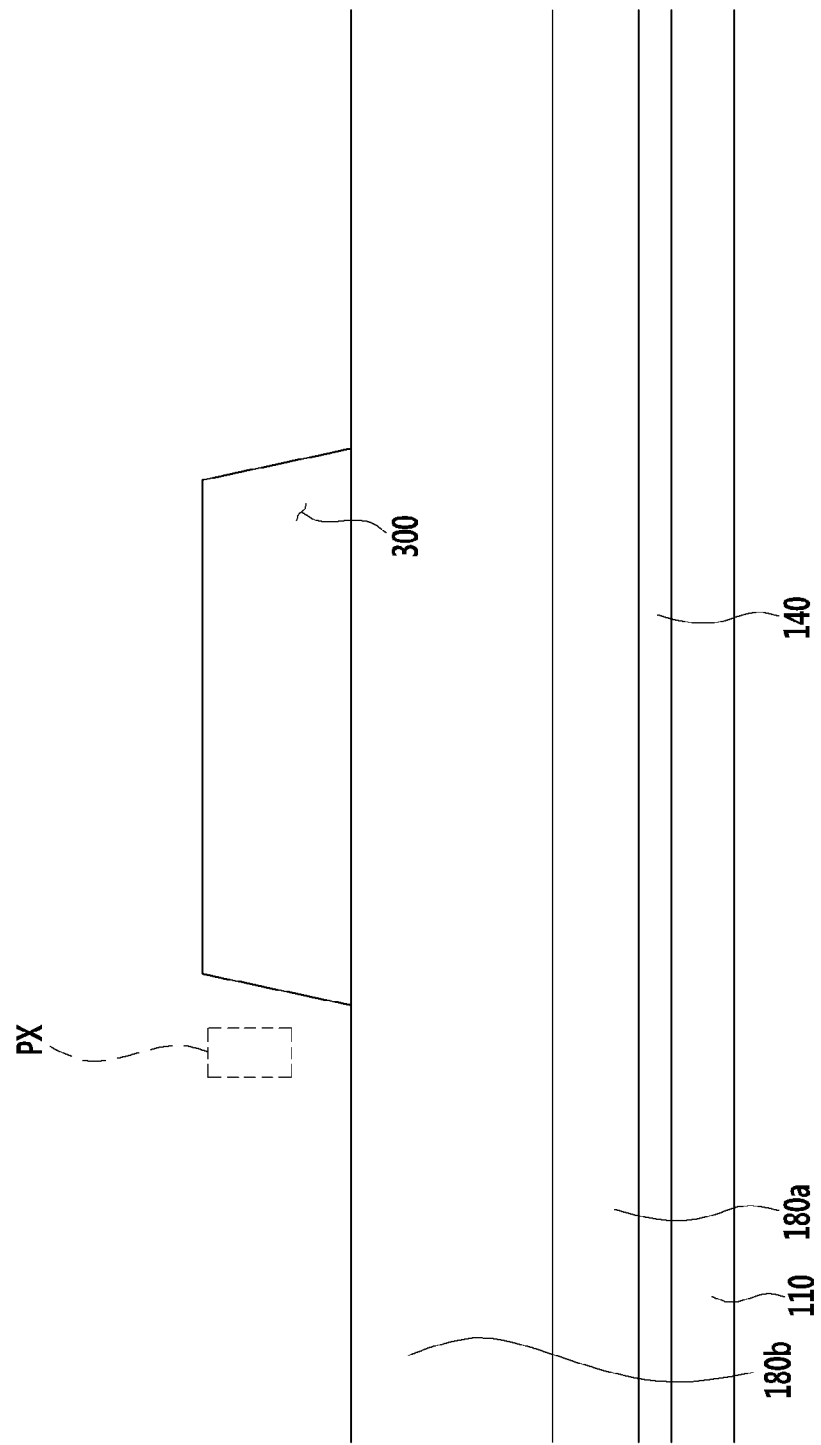

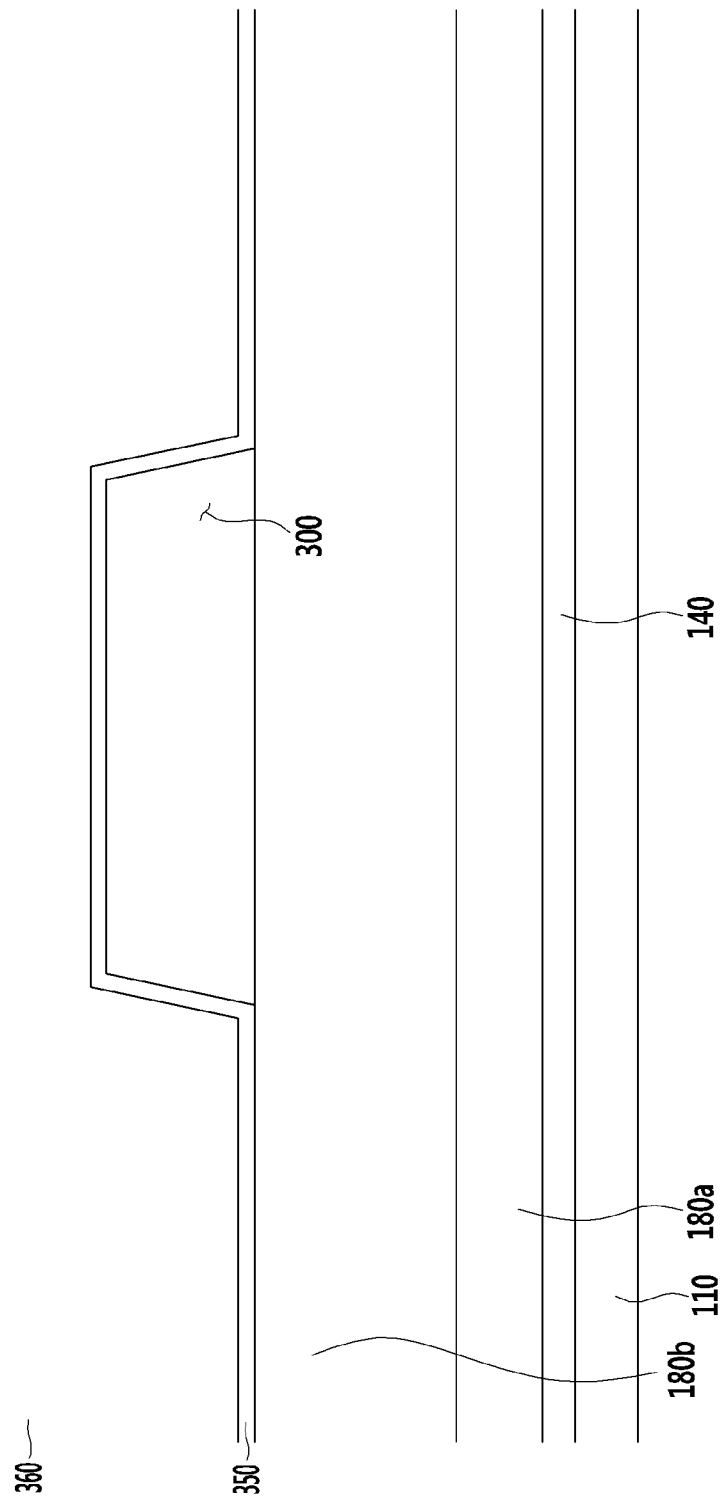

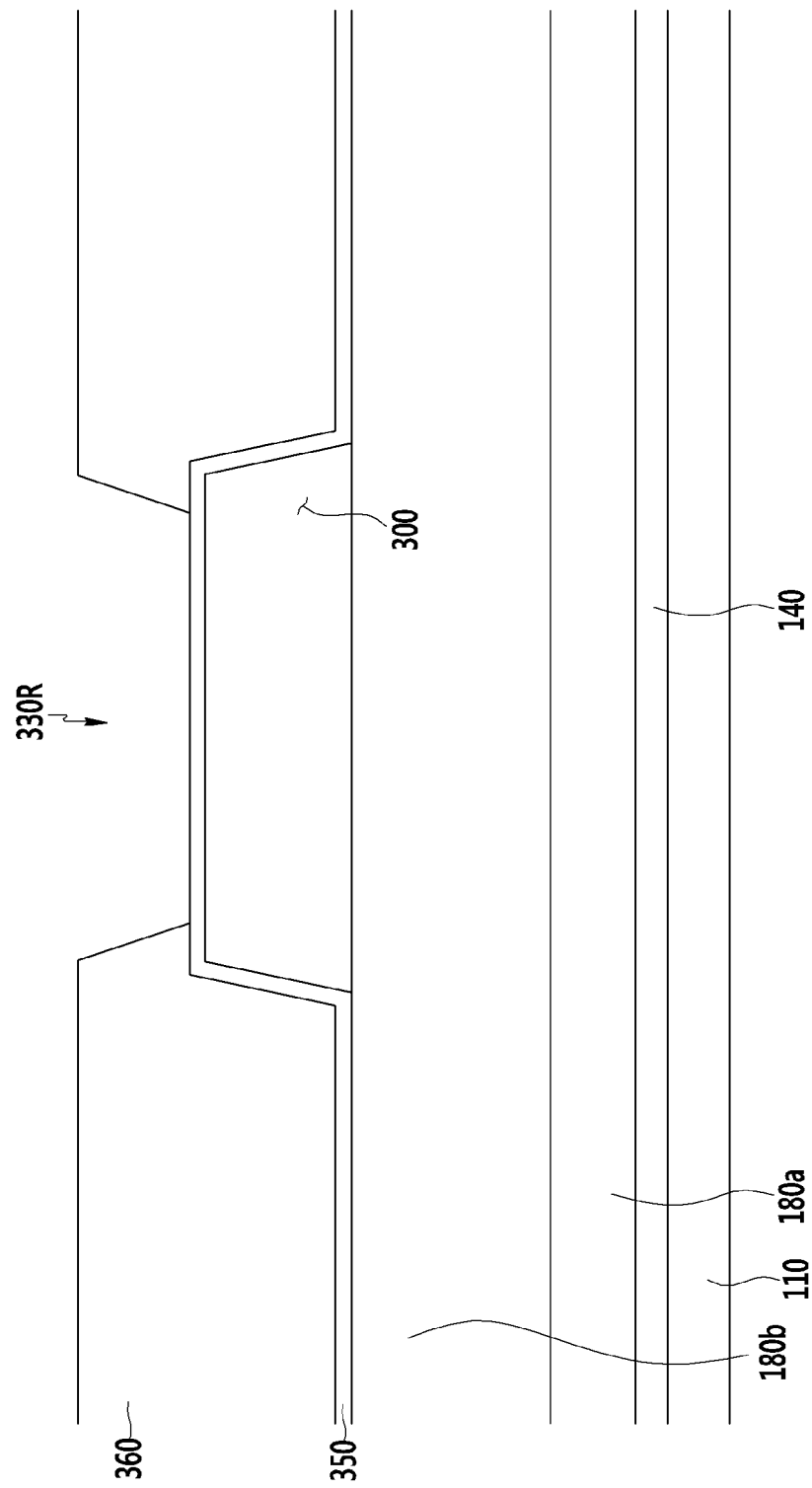

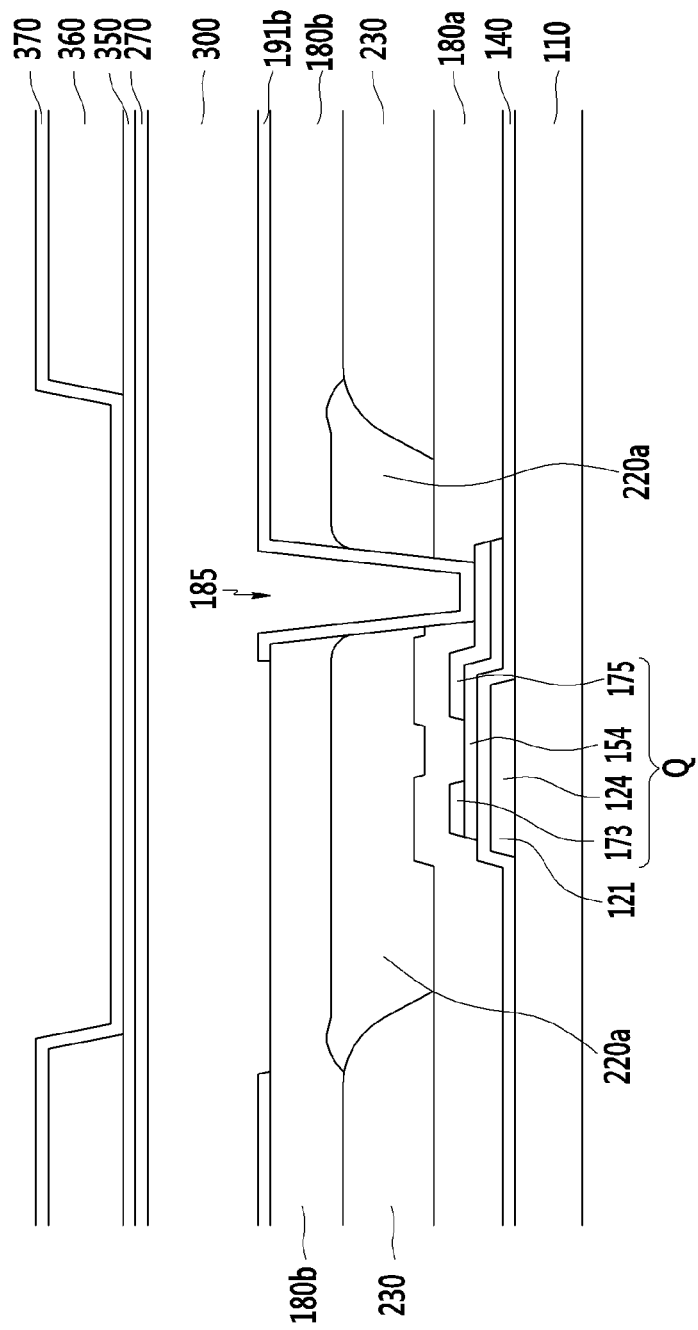

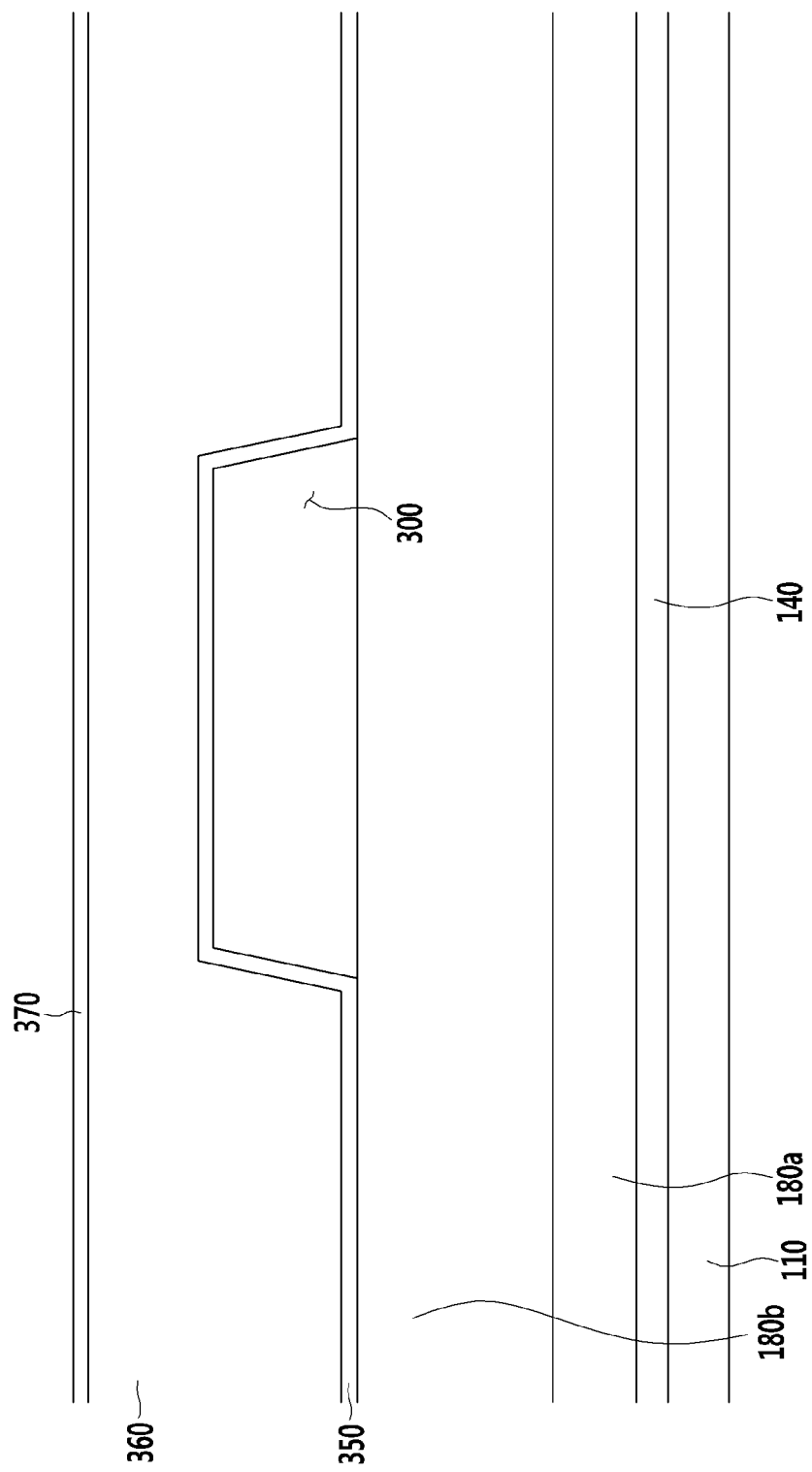

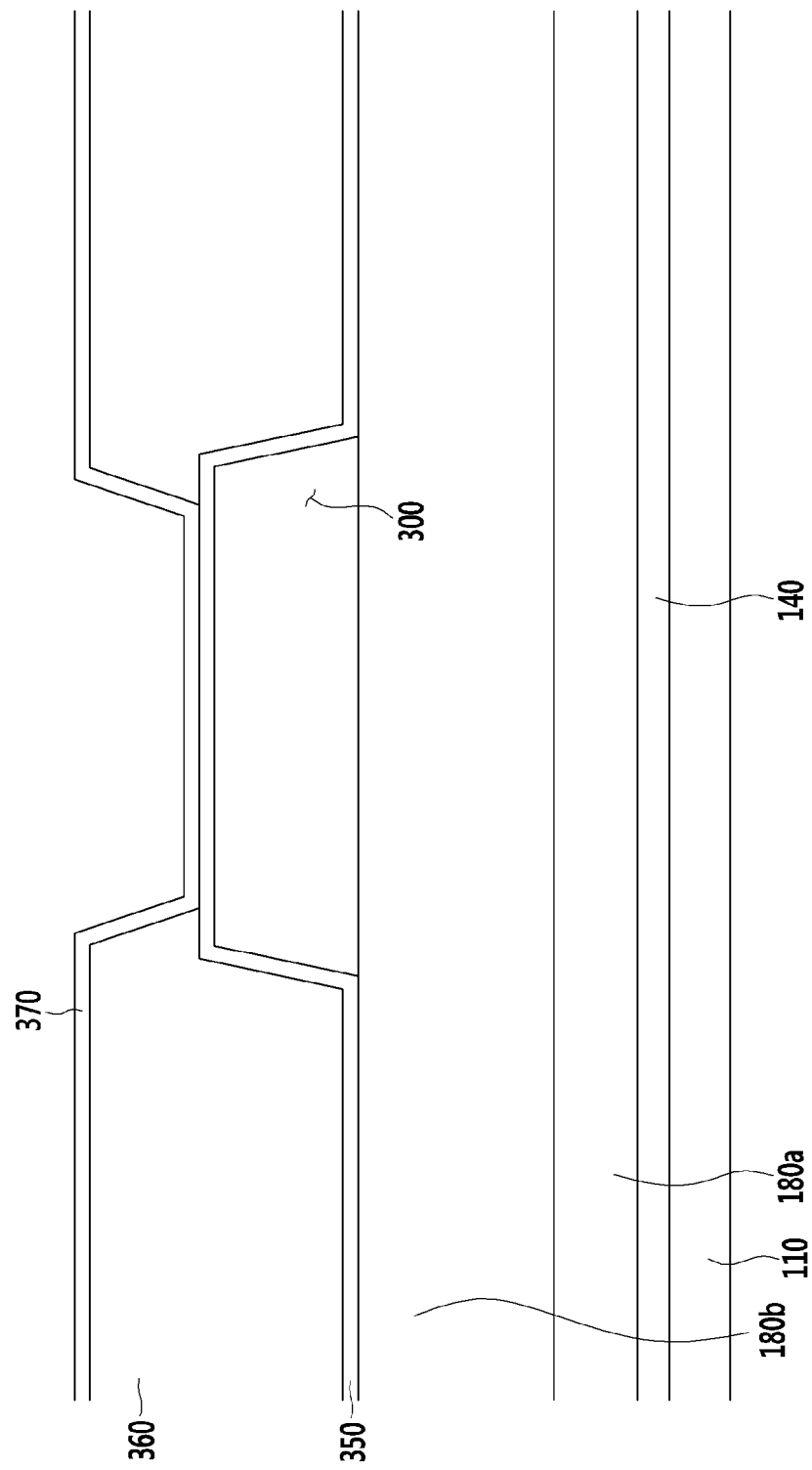

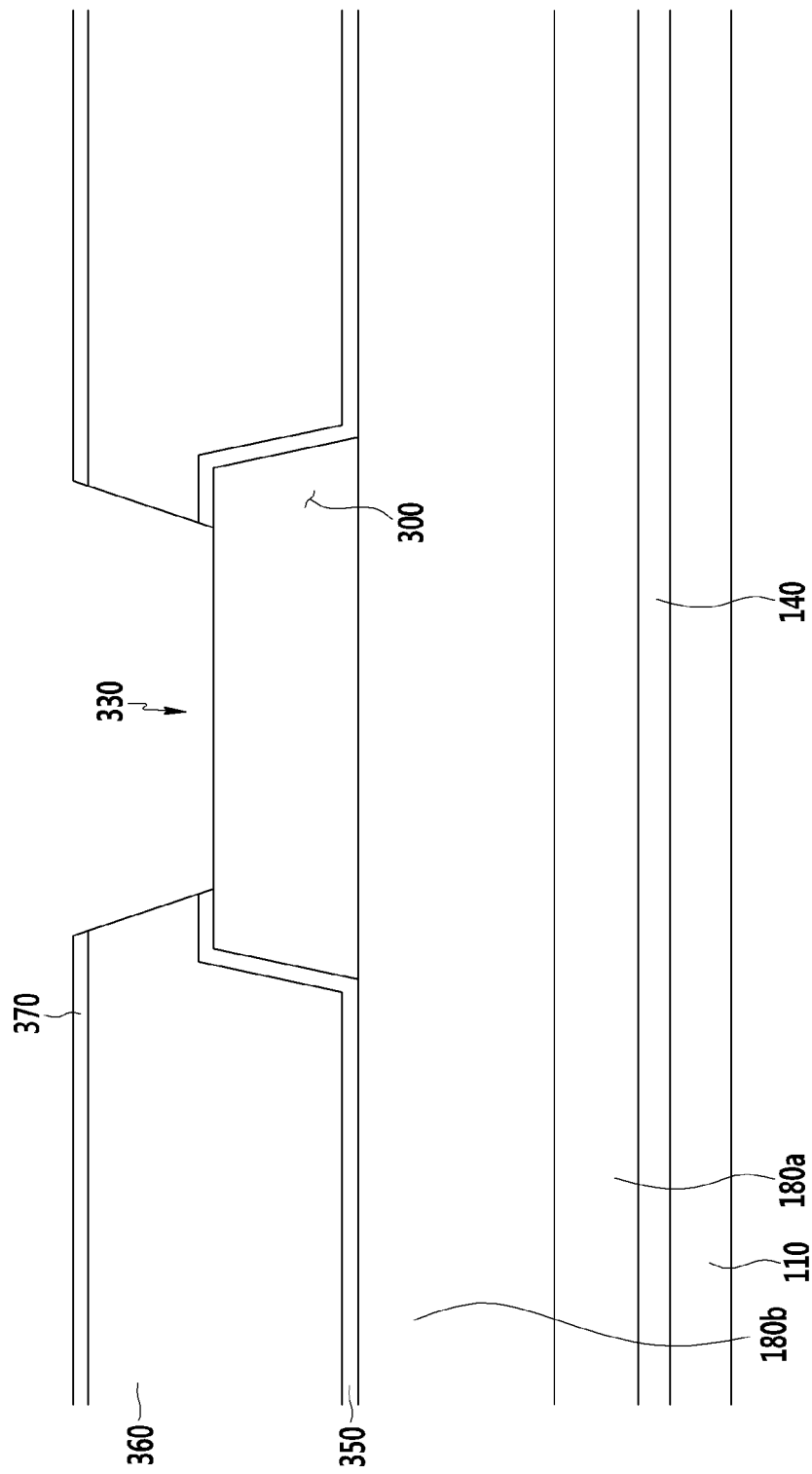

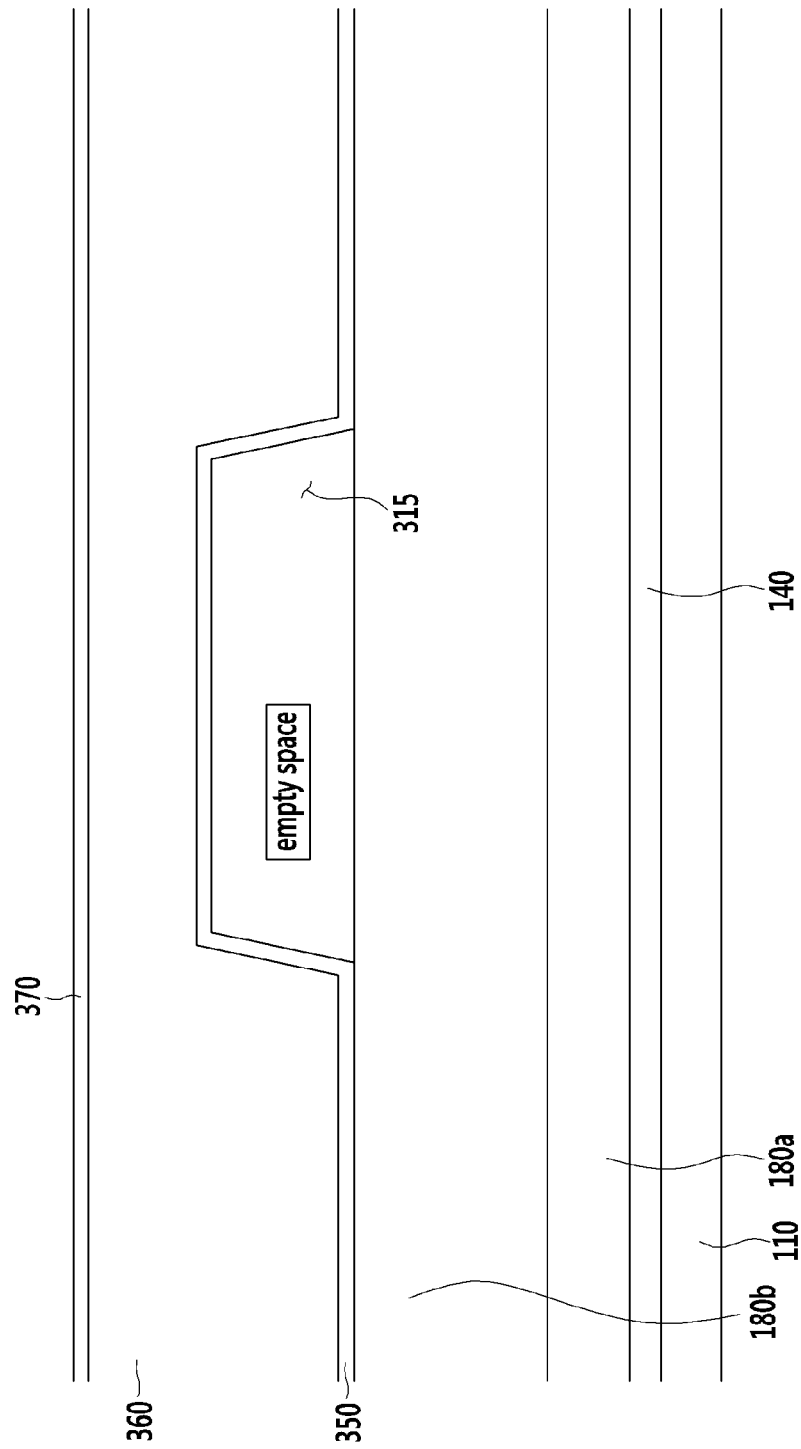

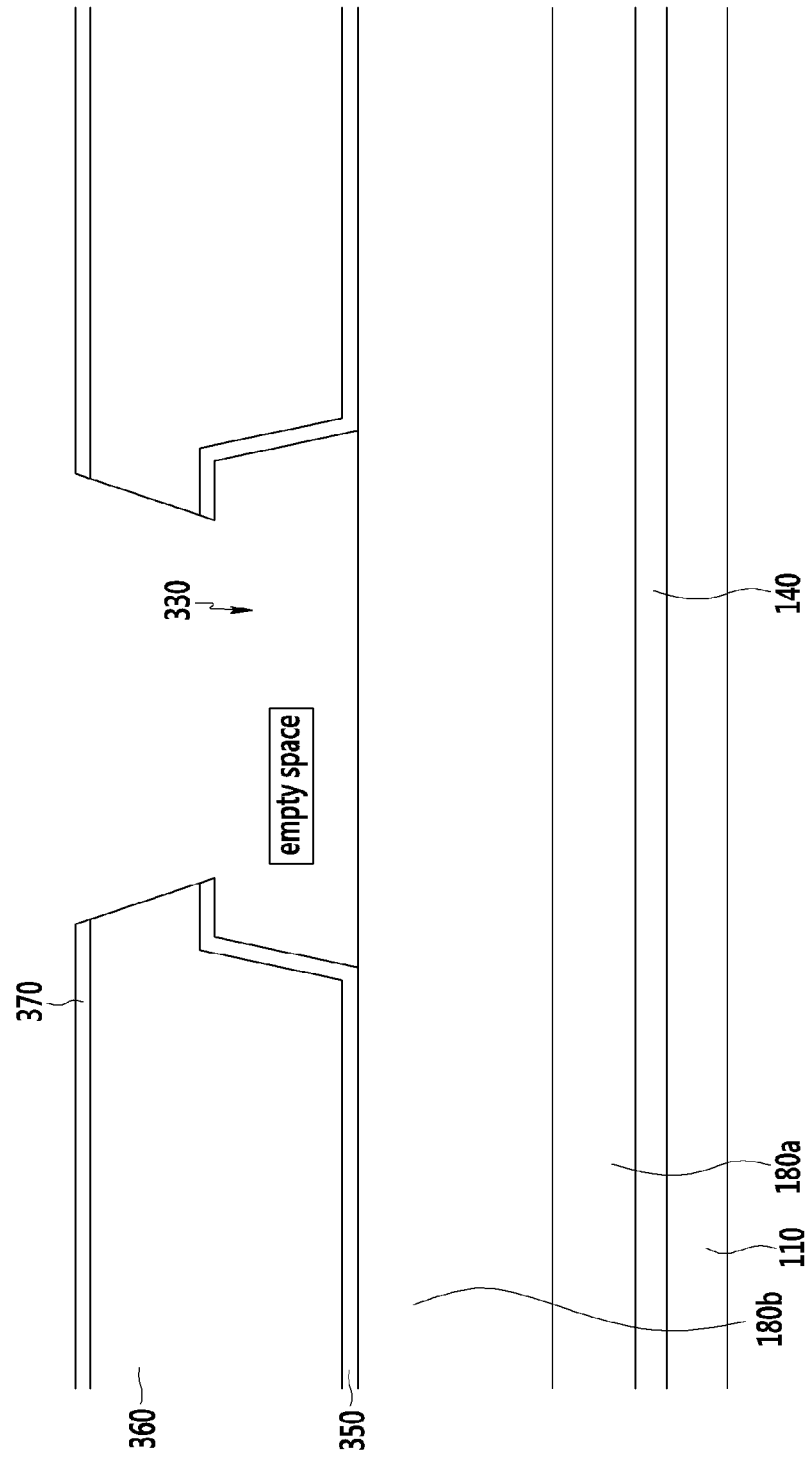

LIQUID CRYSTAL DISPLAY AND METHOD OF MANUFACTURING THE SAME

CROSS-REFERENCE TO RELATED APPLICATIONS

Any and all applications for which a foreign or domestic priority claim is identified in the Application Data Sheet as filed with the present application are hereby incorporated by reference under 37 CFR 1.57.

This application claims priority to and the benefit of Korean Patent Application No. 10-2013-0127341 filed in the Korean Intellectual Property Office on Oct. 24, 2013, the entire contents of which are incorporated herein by reference.

BACKGROUND

1. Field

The present disclosure relates to a liquid crystal display and a manufacturing method thereof.

2. Description of the Related Technology

A liquid crystal display is one of flat panel display devices that are being widely used. A liquid crystal display typically includes two display panels, wherein field generating electrodes such as a pixel electrode and a common electrode are formed with a liquid crystal layer interposed therebetween.

The liquid crystal display generates an electric field in a liquid crystal layer by applying a voltage to the field generating electrodes to determine orientations of liquid crystal molecules of the liquid crystal layer and to control polarization of incident light, thereby displaying an image.

The above information disclosed in this Background section is only for enhancement of understanding of the background of the invention, and therefore it may contain information that does not form the prior art that is already known in this country to a person of ordinary skill in the art.

SUMMARY OF CERTAIN INVENTIVE ASPECTS

The present disclosure has been made in an effort to provide a liquid crystal display and a manufacturing method thereof, having advantages of being capable of preventing light leakage caused by remaining liquid crystal materials.

An embodiment provides a liquid crystal display including: a substrate; a thin film transistor disposed on the substrate; a pixel electrode disposed on the thin film transistor; a roof layer facing the pixel electrode; a plurality of microcavities formed between the pixel electrode and the roof layer, each microcavity of the plurality of microcavities including liquid crystal materials; a trench formed between the microcavities; and a buffer region formed at an end portion of the trench.

The trench may have a first width, the buffer region may have a second width, and the second width may be larger than the first width.

The buffer region may be covered with the roof layer.

At least a portion of liquid crystal materials may be contained in the buffer region.

An air hole is formed at the roof layer located above the buffer region.

The liquid crystal display may further include a capping layer provided above the roof layer, and the capping layer may cover the trench and the air hole.

The buffer region may include a plurality of buffer regions formed along one side of a display area, and each of the buffer regions may be formed separately from one another.

Gaps between the buffer regions may be covered with the roof layer.

The liquid crystal display may further include a lower insulating layer and a common electrode provided between each microcavity and the roof layer, and the lower insulating layer is provided on the common electrode.

The thin film transistor may be connected to a data line, and a partition wall formation portion may be provided between the microcavities along an extending direction of the data line.

Another embodiment provides a manufacturing method of a liquid crystal display, including: forming a thin film transistor on a substrate; forming a pixel electrode configured to be connected to one terminal of the thin film transistor; forming a sacrificial layer on the pixel electrode; forming a roof layer on the sacrificial layer; forming a buffer region and a plurality of microcavities with a liquid crystal injection hole by removing the sacrificial layer; injecting an aligning material into the plurality of microcavities; and injecting liquid crystal materials into the plurality of microcavities, wherein a trench is formed between individual microcavities, and the buffer region is formed at an end portion of the trench.

A first width of the trench may be wider than a second width of the buffer region.

The roof layer may be formed to cover the buffer region.

Injecting the liquid crystal materials may include dripping the liquid crystal materials along the trench by using the buffer region.

At least a portion of liquid crystal materials may be contained in the buffer region.

Forming the roof layer may include forming an air hole at a portion of the roof layer which corresponds to a part of the buffer region.

The manufacturing method may further include forming a capping layer above the roof layer, and the capping layer may be formed to cover the trench and the air hole.

The buffer region may include a plurality of buffer regions formed along one side of a display area, and the individual buffer regions may be formed separately from one another.

The individual buffer regions formed may have gaps therebetween covered with the roof layer.

The manufacturing method may further include forming a lower insulating layer and a common electrode between the microcavities and the roof layer, and the lower insulating layer may be formed on the common electrode.

In embodiments disclosed herein, it is possible to prevent light leakage caused by remaining liquid crystal materials by forming a buffer space in which the remaining liquid crystal materials can be collected at an edge of a trench formed between a plurality of microcavities.

BRIEF DESCRIPTION OF THE DRAWINGS

FIG. 8 is a cross-sectional view taken along line VIII-VIII shown in FIG. 1.

FIG. 9 is a cross-sectional view showing adjacent buffer spaces in the liquid crystal display of an embodiment.

DETAILED DESCRIPTION OF CERTAIN INVENTIVE EMBODIMENTS

Figure 1:
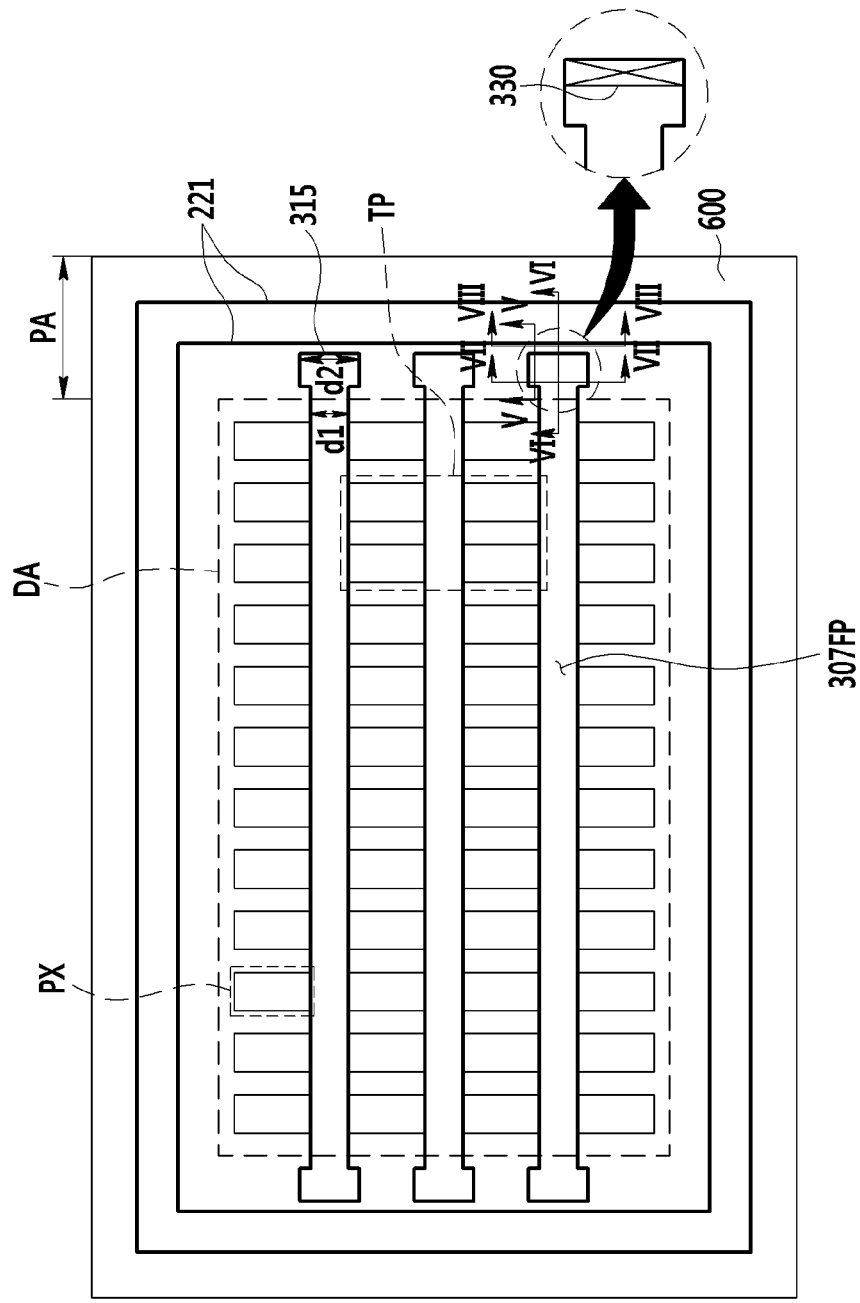
FIG. 1 is a top plan view showing a liquid crystal display in accordance with an embodiment.

Hereinafter, certain embodiments will be described in detail with reference to the accompanying drawings. As those skilled in the art would realize, the described embodiments may be modified in various ways, without departing from the spirit or scope of the present invention. On the contrary, embodiments introduced herein are provided to make disclosed contents thorough and complete, and to sufficiently transfer the spirit of the present invention to those skilled in the art.

In the drawings, the thickness of layers, films, panels, regions, etc., may be exaggerated for clarity. It will be understood that when a layer is referred to as being "on" another layer or substrate, it can be directly on the other layer or substrate, or intervening elements may also be present. Like reference numerals generally designate like elements throughout the specification.

A technique of forming a cavity in a unit of a pixel and filling the cavity with liquid crystals to implement a display has been developed for liquid crystal displays. This technique serves to manufacture a display by forming a sacrificial layer with an organic material, forming a roof layer at an upper portion of the sacrificial layer, removing the sacrificial layer, and filling an empty space formed through the removal of the sacrificial layer with liquid crystals through a liquid crystal injection hole, instead of forming an upper panel on a lower panel.

In an operation for manufacturing such a display device, some of the liquid crystal materials may remain after being injected into the cavity. These remaining liquid crystal materials may exist on a roof layer, thereby generating light leakage when the display device is driven.

Figure 2:
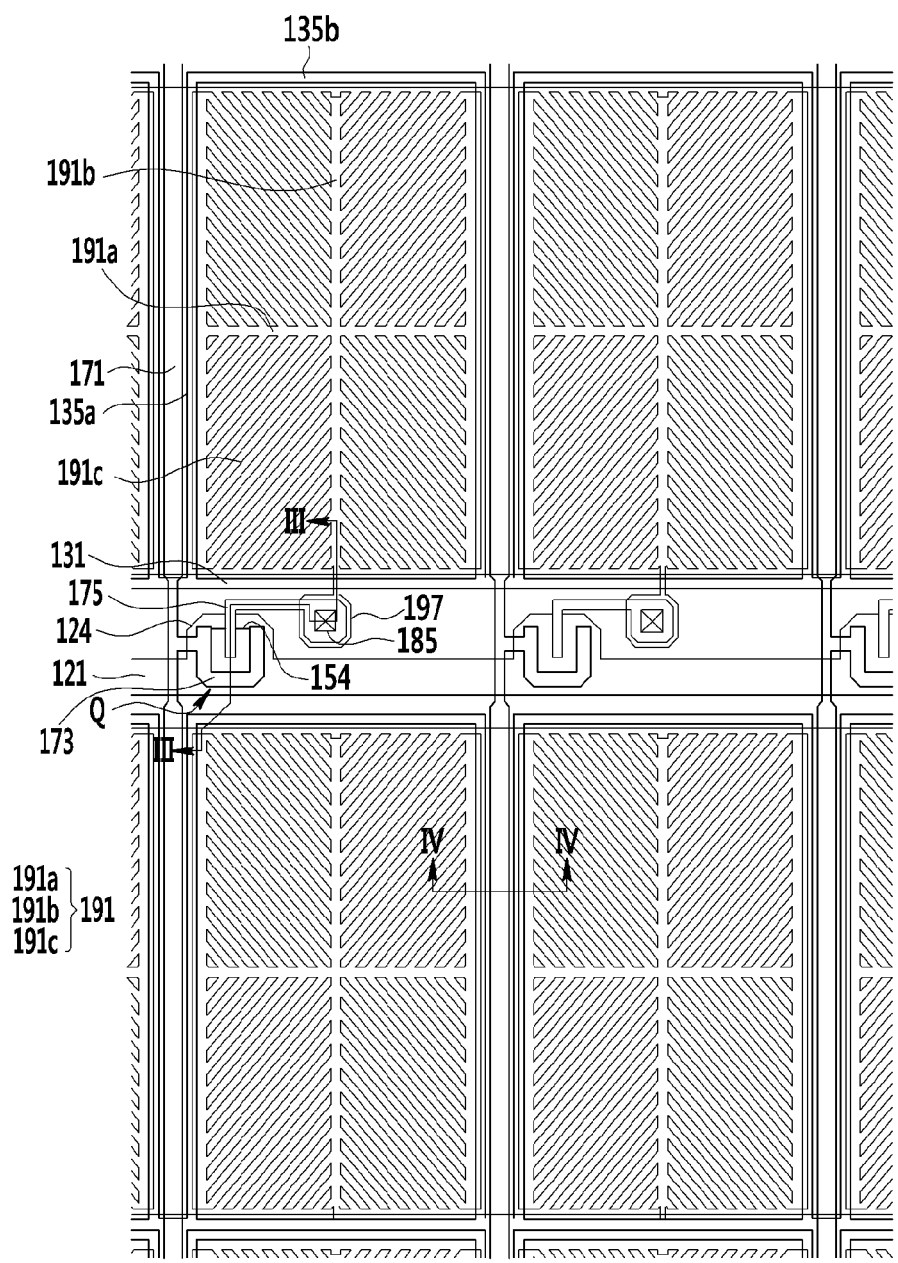
FIG. 2 is a top plan view partially showing a central portion of a plurality of pixels shown in FIG. 1.
Figure 3:
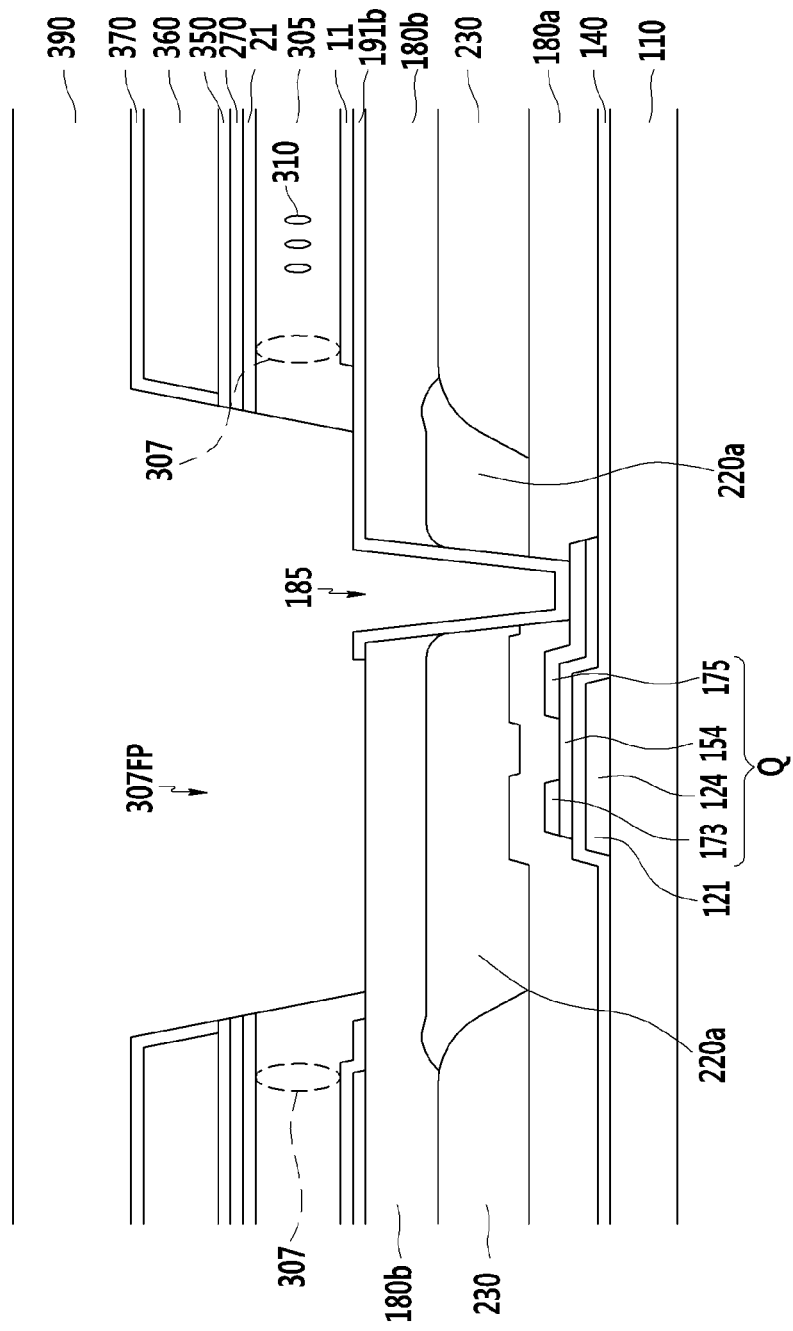
FIG. 3 is a cross-sectional view taken along line III-III shown in FIG. 2.
Figure 4:
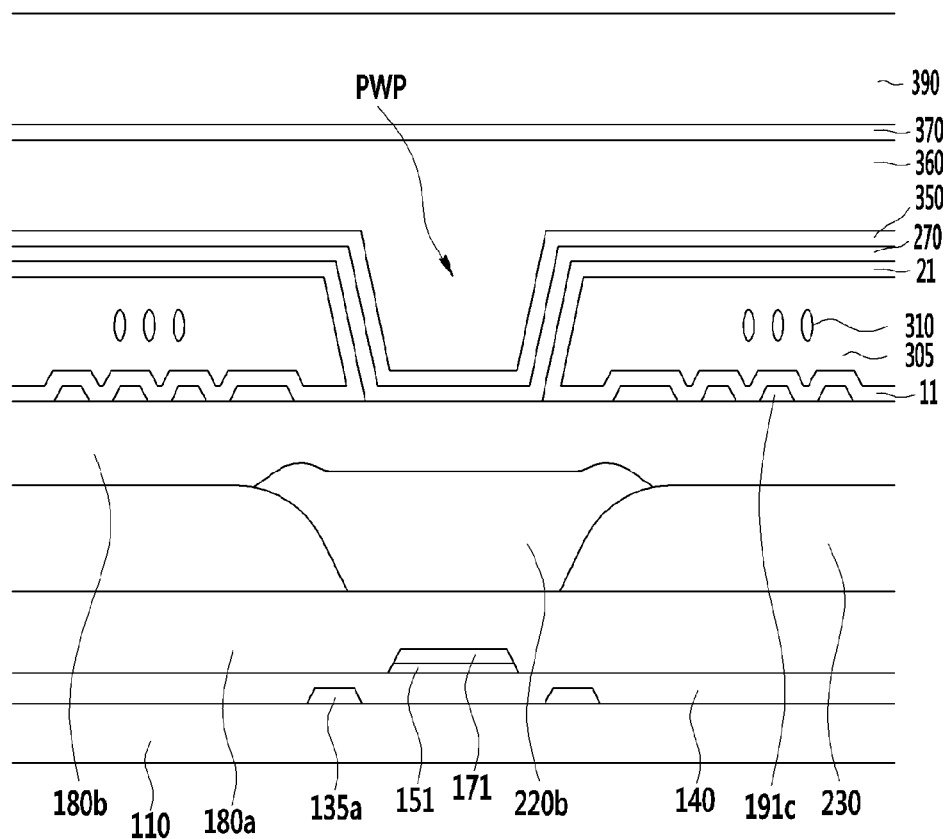
FIG. 4 is a cross-sectional view taken along line IV-IV shown in FIG. 2.
Figure 5:
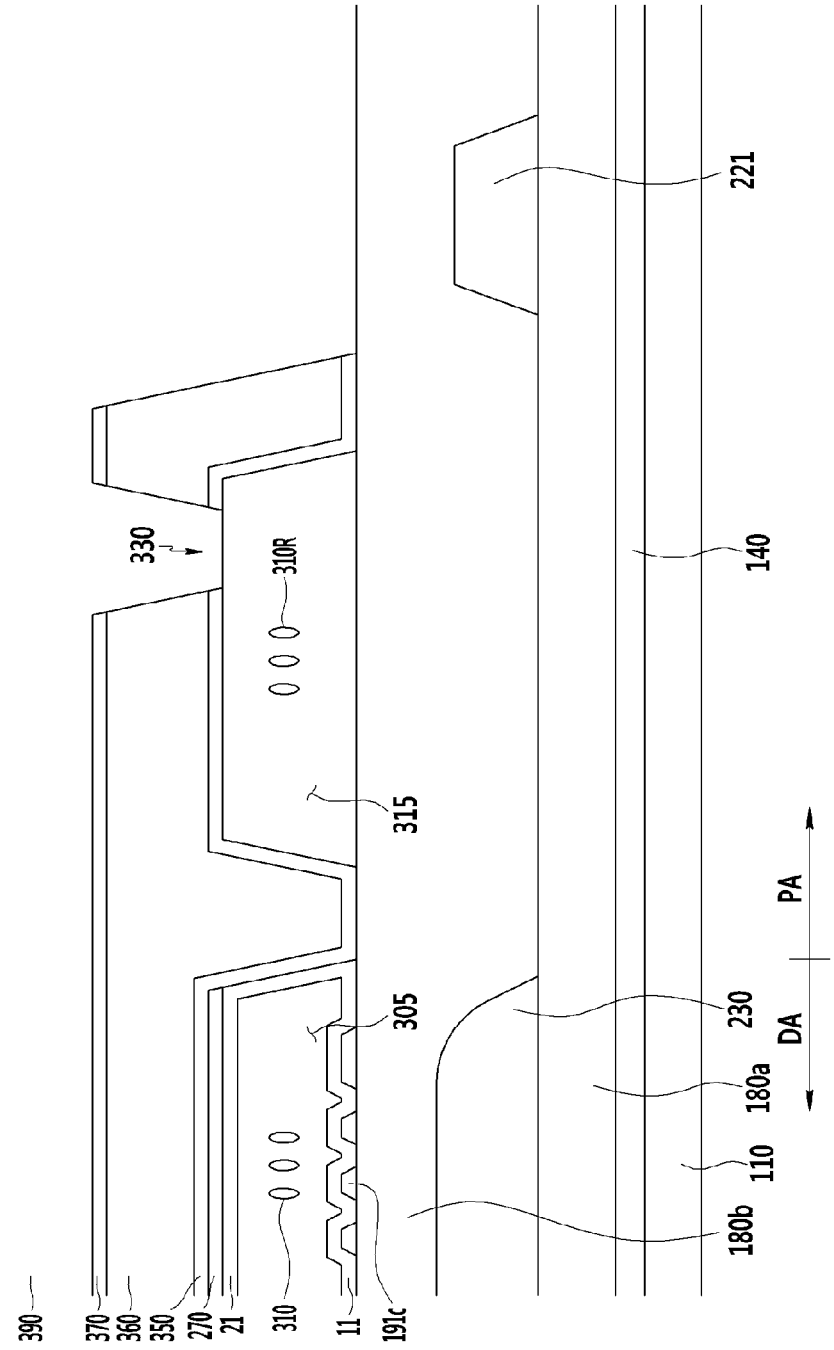
FIG. 5 is a cross-sectional view taken along line V-V shown in FIG. 1.
Figure 6:
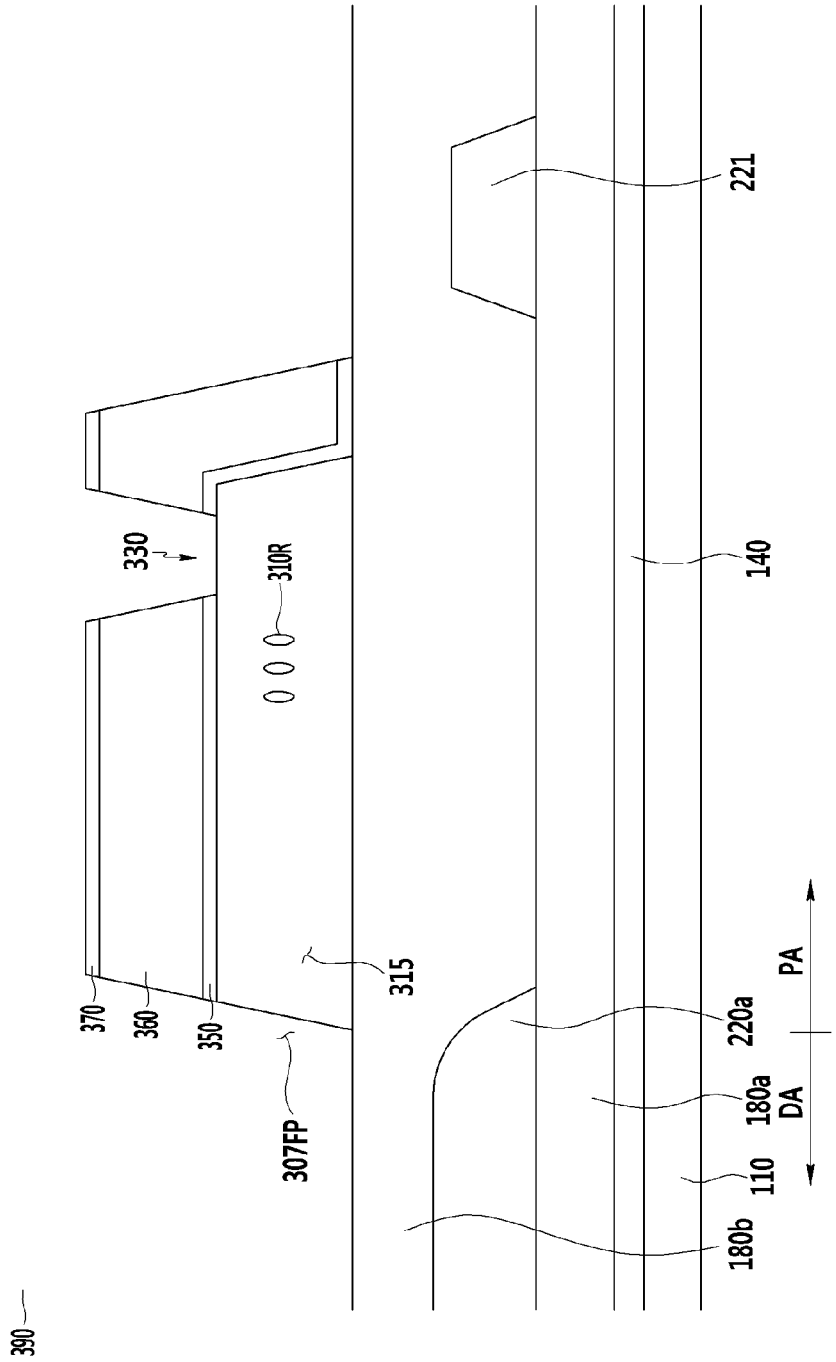
FIG. 6 is a cross-sectional view taken along line VI-VI shown in FIG. 1.
Figure 7:
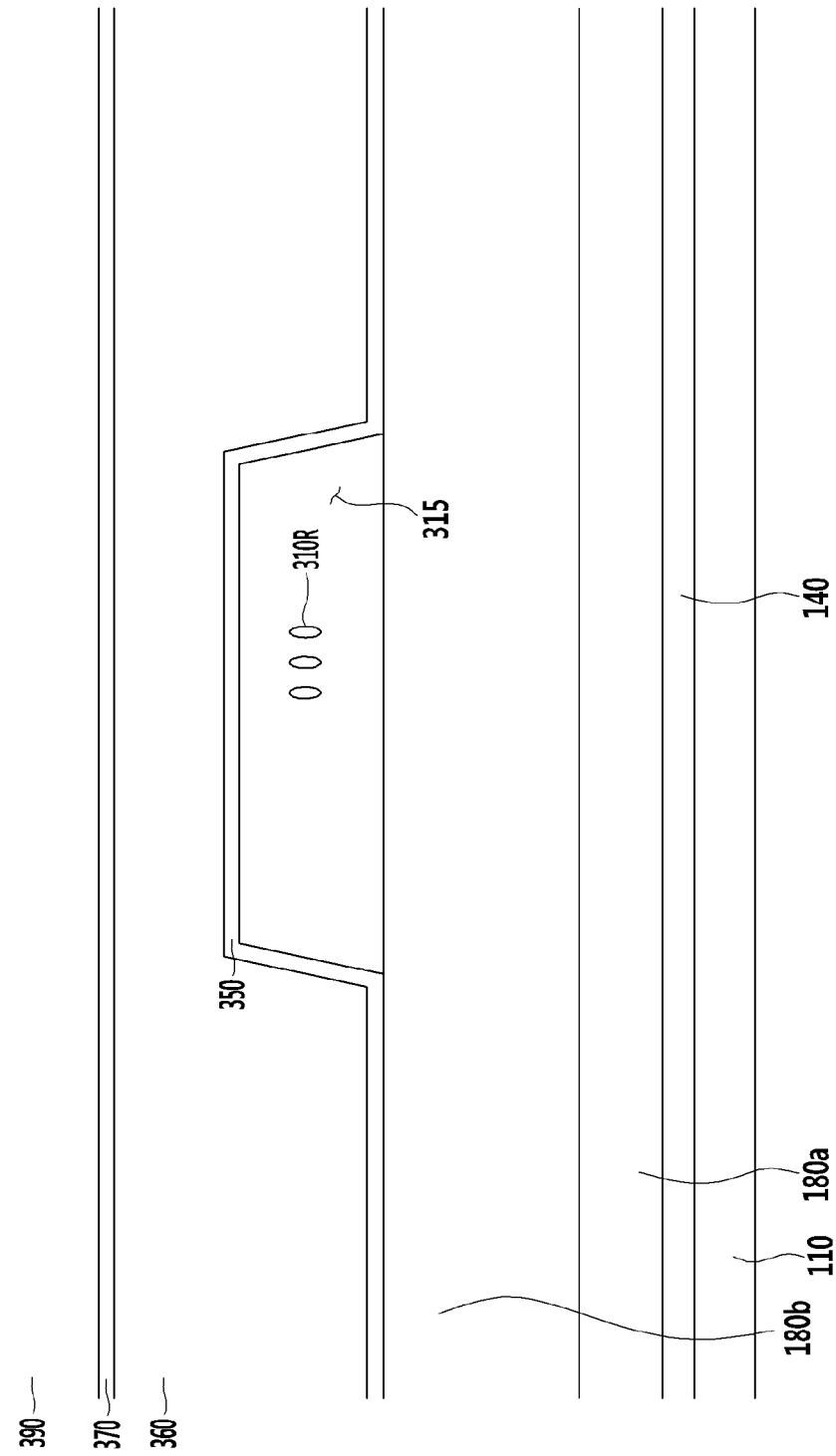
FIG. 7 is a cross-sectional view taken along line VII-VII shown in FIG. 1.

FIG. 1 is a top plan view showing a liquid crystal display in accordance with an embodiment. FIG. 2 is a top plan view partially showing a central portion of a plurality of pixels shown in FIG. 1. FIG. 3 is a cross-sectional view taken along line III-III shown in FIG. 2. FIG. 4 is a cross-sectional view taken along line IV-IV shown in FIG. 2. FIG. 5 is a cross-sectional view taken along line V-V shown in FIG. 1. FIG. 6 is a cross-sectional view taken along line VI-VI shown in FIG. 1. FIG. 7 is a cross-sectional view taken along line VII-VII shown in FIG. 1. FIG. 8 is a cross-sectional view taken along line VIII-VIII shown in FIG. 1. FIG. 9 is a cross-sectional view showing adjacent buffer spaces in the liquid crystal display of an embodiment.

Referring to FIG. 1, the liquid crystal display includes a display area DA and a peripheral area PA. The display area DA corresponds to an internal part of a quadrangle indicated by dotted lines, and the peripheral area PA corresponds to an external part of the quadrangle indicated by the dotted lines. The display area DA serves as a region for outputting an actual image, and the peripheral area PA includes a pad unit 600 or a driver. For example, in a pad unit 600, a pad may be provided at one side of the peripheral area PA or two sides thereof that are not opposite to each other.

A plurality of pixels PX are provided in the display area DA, and a light blocking layer 221, for covering a portion in which light leakage may occur, is provided in the peripheral area PA. The pixels PX are formed with microcavities, which is described below. The light blocking layer 221 may be formed at an outer circumference of the display area DA in such a way so as to surround the display area DA. The light blocking layer 221 may be formed of the same layer as that of a light blocking member provided in the display area DA and of the same material as that of the light blocking member in the peripheral area PA. The light blocking layer 221 may serve to prevent visible reflection of external light.

In one embodiment, a trench 307FP is formed between rows of the pixels PX or microcavities formed in the pixels PX. The trench 307FP may longitudinally extend in a horizontal direction in the drawings. The trench 307 FP includes a plurality of trenches formed between pixels PX. A buffer region 315 having a second width d2 that is wider than a first width d1 of the trench 307FP is formed at opposite ends of the trench 307FP. Specifically, buffer regions 315 are formed at opposite ends of each of the trenches 307FP, to be horizontally arranged adjacent to each other. The adjacent buffer regions 315 are separated from each other. Alternatively, although not shown, the buffer regions 315 may be formed at one end of each of the trenches 307FP.

The buffer regions 315 may be formed at an edge of the display area DA or the peripheral area PA.

A pixel PX located in the display area DA will now be described in detail with reference to FIG. 2 to FIG. 4. FIG. 2 shows 4 (2×2) pixels as a portion TP of the pixels shown in FIG. 1.

Referring to FIG. 2 to FIG. 4, a gate line 121 and a storage electrode line 131 are formed on a substrate 110 made of transparent glass or plastic. The gate line 121 includes a gate electrode 124. The storage electrode line 131 is mainly extended in a horizontal direction, and transfers a predetermined voltage, such as a common voltage Vcom. The storage electrode line 131 includes a pair of vertical storage electrode portions 135a substantially extended to be perpendicular to the gate line 121, and a horizontal storage electrode portion 135b connecting ends of the pair of vertical portions 135a to each other. The storage electrode portions 135a and 135b have a structure surrounding the pixel electrode 191.

A gate insulating layer 140 is formed on the gate line 121 and the storage electrode line 131. A semiconductor layer 151 disposed under a data line 171 and a semiconductor layer 154 disposed under a source/drain electrode and at a channel portion of a thin film transistor Q are formed on the gate insulating layer 140.

A plurality of ohmic contacts may be formed on each of the semiconductor layers 151 and 154, and between the data line 171 and the source/drain electrode, but they are omitted in the drawings.

Data conductors 171, 173, and 175 including a source electrode 173, a data line 171 connected with the source electrode 173, and a drain electrode 175 are formed on each of the semiconductor layers 151 and 154 and the gate insulating layer 140.

The gate electrode 124, the source electrode 173, and the drain electrode 175 form a thin film transistor Q together with the semiconductor layer 154, and a channel of the thin film transistor Q is formed on a portion of the semiconductor layer 154 between the source electrode 173 and the drain electrode 175.

A first interlayer insulating layer 180a is formed on the data conductors 171, 173, and 175 and an exposed portion of the semiconductor layer 154. The first interlayer insulating layer 180a may include an inorganic insulating material, such as, for example, a silicon nitride (SiNx) and a silicon oxide (SiOx), or an organic insulating material.

A color filter 230 and light blocking members 220a and 220b are formed on the first interlayer insulating layer 180a.

Each of the light blocking members 220a and 220b has a lattice structure having an opening corresponding to a region displaying an image, and is formed of a material preventing light from being transmitted therethrough. The color filter 230 is formed at openings of the light blocking members 220a and 220b. The light blocking members 220a and 220b include a horizontal light blocking member 220a formed in a direction parallel to the gate line 121 and a vertical light blocking member 220b formed in a direction parallel to the data line 171.

The color filter 230 may display one of primary colors, such as, for example, three primary colors including red, green, and blue. However, the colors are not limited to the three primary colors including red, green, and blue, and the color filter 230 may also display one among a cyan-based color, a magenta-based color, a yellow-based color, and a white-based color. The color filter 230 may be formed of materials displaying different colors for each adjacent pixel.

A second interlayer insulating layer 180b covering the color filter 230 and the light blocking members 220a and 220b is formed on the color filter 230 and the light blocking members 220a and 220b. The second interlayer insulating layer 180b may include an inorganic insulating material, such as, for example, a silicon nitride (SiNx) and a silicon oxide (SiOx), or an organic insulating material.

If a step is generated due to a difference in a thickness between the color filter 230 and the light blocking members 220a and 220b, the second interlayer insulating layer 180b includes an organic insulating material, so that it is possible to decrease or remove the step generated.

The color filter 230, the light blocking members 220a and 220b, and the interlayer insulating layers 180a and 180b have a contact hole 185 exposing the drain electrode 175.

A pixel electrode 191 is disposed on the second interlayer insulating layer 180b. The pixel electrode 191 may be formed of a transparent conductive material, such as, for example, ITO or IZO.

An overall shape of the pixel electrode 191 is a quadrangle, and the pixel electrode 191 includes cross stems configured by a horizontal stem 191a and a vertical stem 191b crossing the horizontal stem 191a. Further, the pixel electrode 191 is divided into four subregions by the horizontal stem 191a and the vertical stem 191b, and each subregion includes a plurality of minute branches 191c. In one embodiment, the pixel electrode 191 may further include an outer stem surrounding an outer circumference of the pixel electrode 191.

The minute branches 191c of the pixel electrode 191 form an angle of approximately 40° to 45° with the gate line 121 or with the horizontal stem 191a. Further, the minute branches of two adjacent subregions may be perpendicular to each other. Furthermore, a width of the minute branch is gradually increased, or a distance between the minute branches 191c may be varied.

The pixel electrode 191 includes an extension 197 which is connected at a lower end of the vertical stem 191b and has a larger area than the vertical stem 191b, and is physically and electrically connected with the drain electrode 175 through the contact hole 185 at the extension 197 to receive a data voltage from the data electrode 175.

The thin film transistor Q and the pixel electrode 191 described above are just described as an example, and a structure of the thin film transistor and a design of the pixel electrode may be modified in order to improve side visibility.

A lower alignment layer 11 is formed on the pixel electrode 191, and may be a vertical alignment layer. The lower alignment layer 11, similar to a liquid crystal alignment layer made of a material such as, for example, polyamic acid, polysiloxane, polyimide, or the like, may include at least one of generally used materials.

An upper alignment layer 21 is disposed at a portion facing the lower alignment layer 11, and a microcavity 305 is formed between the lower alignment layer 11 and the upper alignment layer 21. A liquid crystal material including liquid crystal molecules 310 is injected into the microcavity 305 through a liquid crystal injection hole 307. The microcavity 305 may be formed in a column direction, that is, a vertical direction, of the pixel electrode 191. In one embodiment, the alignment material forming the alignment layers 11 and 21 and the liquid crystal material including the liquid crystal molecules 310 may be injected into the microcavity 305 by using capillary force.

The microcavity 305 is divided in a vertical direction by a plurality of trenches 307FP disposed at a portion overlapping the gate line 121, and a plurality of microcavities 305 may be formed along the direction in which the gate line 121 is extended. Each of the plurality of formed microcavities 305 may correspond to a pixel area, and the pixel areas may correspond to a region displaying an image.

A common electrode 270 and a lower insulating layer 350 are disposed on the upper alignment layer 21. The common electrode 270 receives the common voltage, and generates an electric field together with the pixel electrode 191 to which the data voltage is applied to determine a direction in which the liquid crystal molecules 310 disposed at the microcavity 305 between the two electrodes are inclined. The common electrode 270 forms a capacitor with the pixel electrode 191 to maintain the received voltage even after the thin film transistor is turned off. The lower insulating layer 350 may be formed of, for example, a silicon nitride (SiNx) or a silicon oxide (SiOx).

In one embodiment, it is described that the common electrode 270 is formed on the microcavity 305, but in another embodiment, the common electrode 270 may be formed under the microcavity 305, so that liquid crystal driving according to a coplanar electrode (CE) mode is possible.

A roof layer 360 is disposed on the lower insulating layer 350. The roof layer 360 serves to make a support so that the microcavity 305, which is a space between the pixel electrode 191 and the common electrode 270, is formed. The roof layer 360 may include a photoresist or other organic materials.

An upper insulating layer 370 is disposed on the roof layer 360. The upper insulating layer 370 may be brought into contact with an upper surface of the roof layer 360. The upper insulating layer 370 may be formed of, for example, a silicon nitride (SiNx) or a silicon oxide (SiOx).

In one embodiment, a capping layer 390 fills the trench 307FP and covers the liquid crystal injection hole 307 of the microcavity 305 exposed by the trench 307FP. The capping layer 390 includes an organic material or an inorganic material.

In one embodiment, as shown in FIG. 4, a partition wall formation portion PWP is disposed between the microcavities 305 adjacent to each other in a horizontal direction. The partition wall formation portion PWP may be formed in an extending direction of the data line 171, and may be covered by the roof layer 360. The lower insulating layer 350, the common electrode 270, the upper insulating layer 370, and the roof layer 360 are filled in the partition wall formation portion PWP, and the structure forms the partition wall to partition or define the microcavity 305. In one embodiment, since a partition wall structure such as the partition wall formation portion PWP exists between the microcavities 305, even though the insulation substrate 110 is bent, generated stress is small, and a change degree of a cell gap may be considerably reduced.

Hereinafter, an edge of the display area DA or the buffer region 315 provided in the peripheral area PA will be described in detail with reference to FIG. 1, FIG. 5, FIG. 6, FIG. 7, FIG. 8, and FIG. 9.

Referring to FIG. 1, FIG. 5, FIG. 6, FIG. 7, FIG. 8, and FIG. 9, the buffer region 315 is located adjacent to the pixels PX located at the outermost area of the display area DA. The buffer region 315 is covered by the roof layer 360. The lower insulating layer 350 may be located below the roof layer 360 of the buffer region 315, and the upper insulating layer 370 may be located above the roof layer 360 of the buffer region 315. The capping layer 390 may be located on the upper insulating layer 370.

Remaining liquid crystal materials including remaining liquid crystal molecules 310R are contained in the buffer region 315. The remaining liquid crystal materials 310R may be liquid crystal materials remaining after filling the microcavities 305.

Referring to FIG. 5, FIG. 6, and FIG. 8, an air hole 330 extending through the lower insulating layer 350, the roof layer 360, and the upper insulating layer 370 located above the buffer region 315 is formed.

In embodiments of the manufacturing process of the liquid crystal display, the remaining liquid crystal materials 310R are collected at the buffer regions 315 while air is exhausted to the outside of the buffer regions 315. The air hole 330 serves to prevent the collected remaining liquid crystal material from overflowing the buffer regions 315 and flowing over the roof layer 360.

The buffer regions 315 are formed along the edge of the display area DA or one side of the peripheral area PA, and the adjacent buffer regions 315 are located separately from each other. FIG. 9 is a cross-sectional view obtained by cutting the adjacent buffer regions 315 with the cutting line used for FIG. 7. As shown in FIG. 9, the adjacent buffer regions 315 are separated from each other by a first distance "t". The distance between the adjacent buffer regions 315 for such separate arrangement may be minimized as long as each of the buffer regions 315 has a minimum margin. The second width d2 of the buffer region 315 can be maximized by minimizing the first distance t, and as the second width d2 of the buffer region 315 is increased, the remaining liquid crystal materials containing the remaining liquid crystal molecules 310R described below can be easily induced into the buffer region 315.

The roof layer 360 located above the buffer regions 315 may be extended to fill gaps between the buffer regions 315.

If the adjacent buffer regions 315 are connected to each other, any one of the buffer regions 315 may induce more remaining liquid crystal materials. Accordingly, some of the buffer regions 315 may be over-filled with the remaining liquid crystal materials, while some of the buffer regions 315 may not be filled with the liquid crystal materials. Thus, it is preferable to independently form the buffer regions 315.

Although not shown, the second width d2 of the adjacent buffer regions 315 may be differently formed.

In accordance with one embodiment, since the remaining liquid crystal materials are collected in the buffer regions 315, it is possible to prevent light leakage which may occur due to the remaining liquid crystal materials flowing over the roof layer 360.

Hereinafter, a manufacturing method of the liquid crystal display in an embodiment will be described with reference to FIG. 10A to FIG. 16C. The embodiment described below may be modified and implemented in other forms.

Figure 10B:
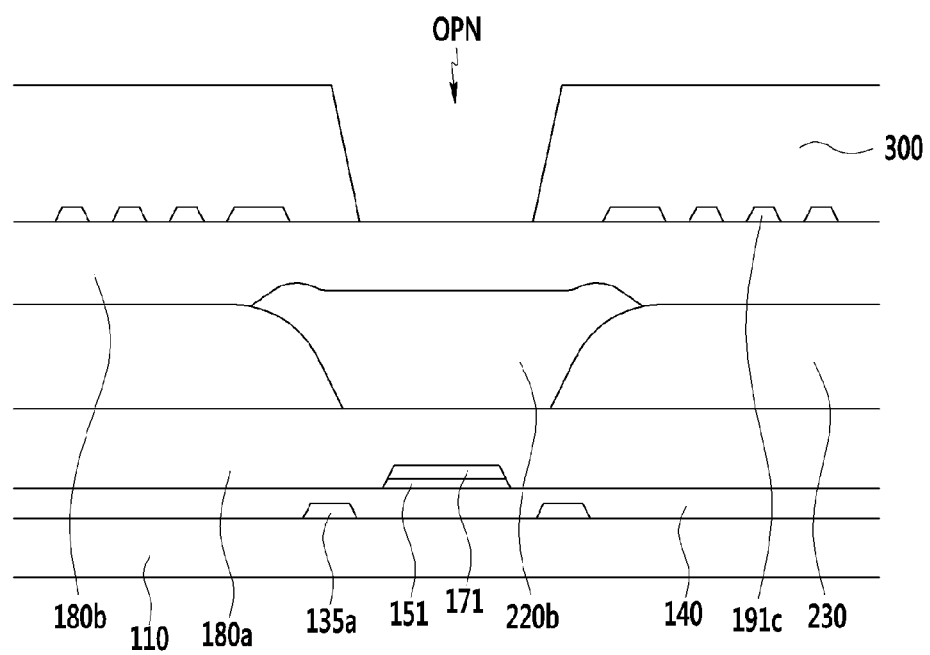
FIG. 10A to FIG. 16C are stepwise cross-sectional views showing a manufacturing method of a liquid crystal display in accordance with an embodiment.
Figure 11:
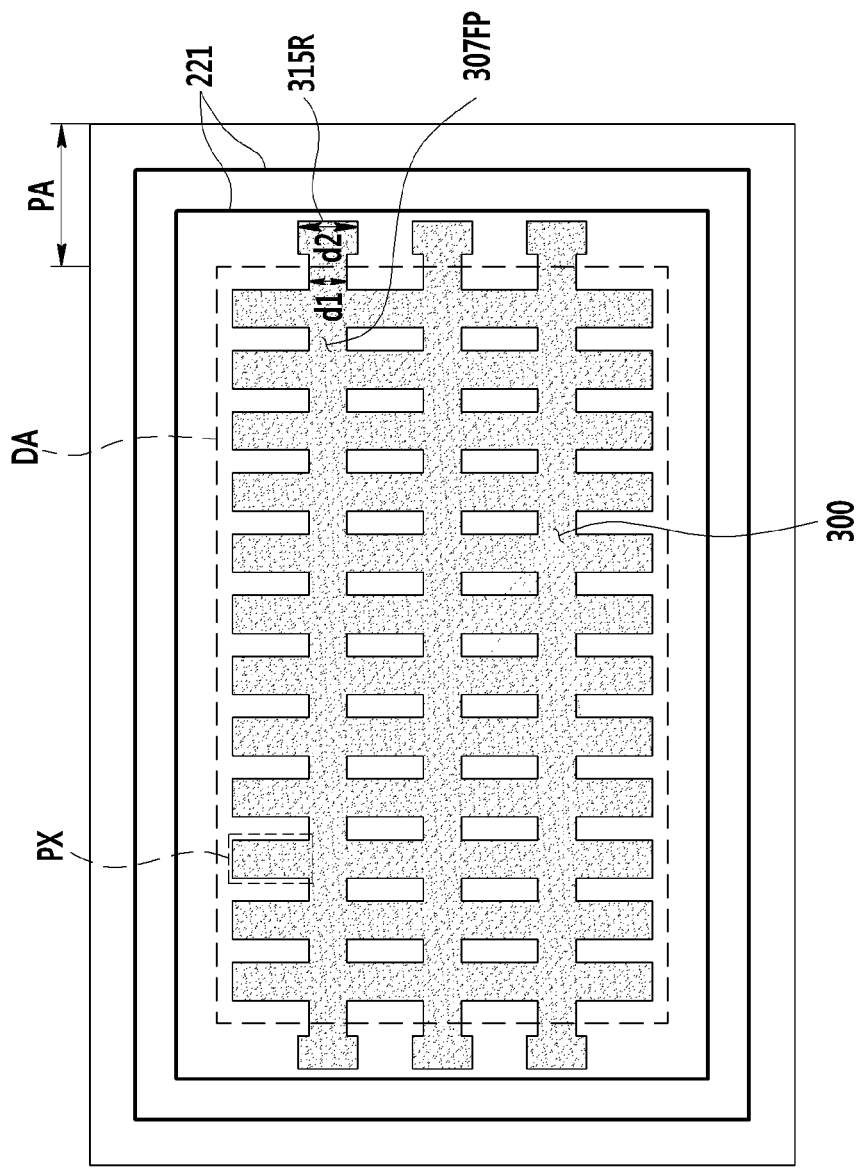
Figure 12A:
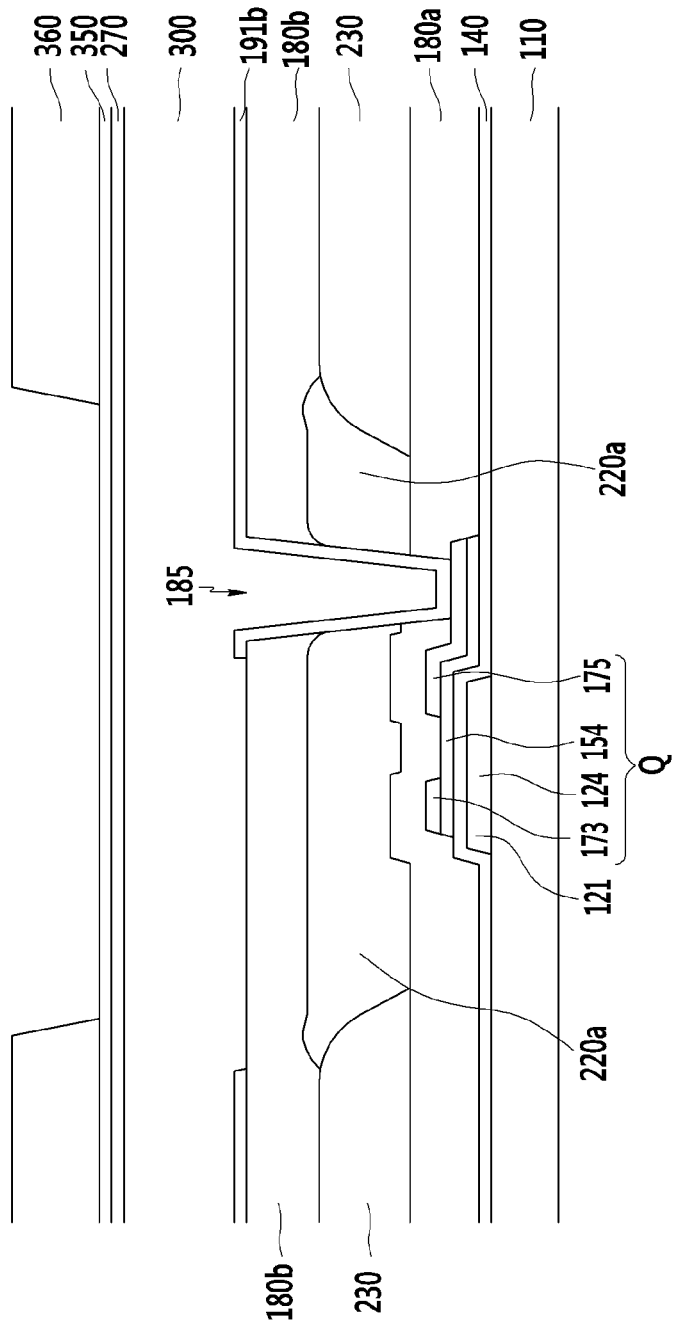
Figure 12B:
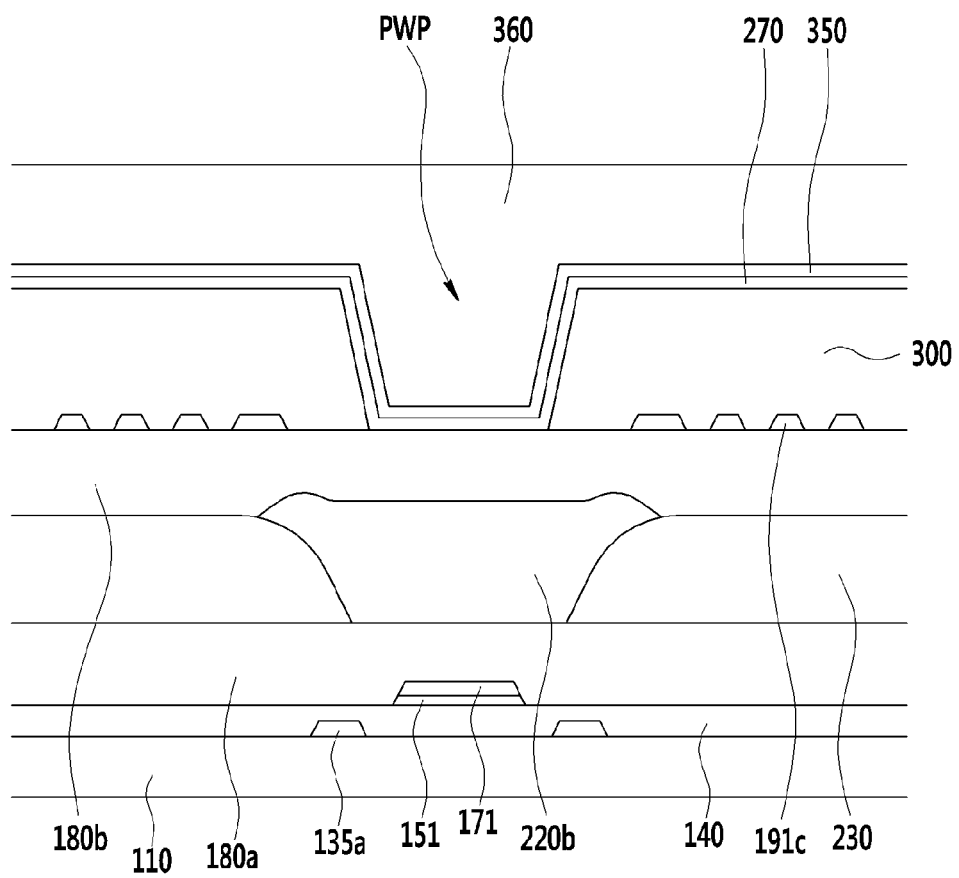
Figure 13B:
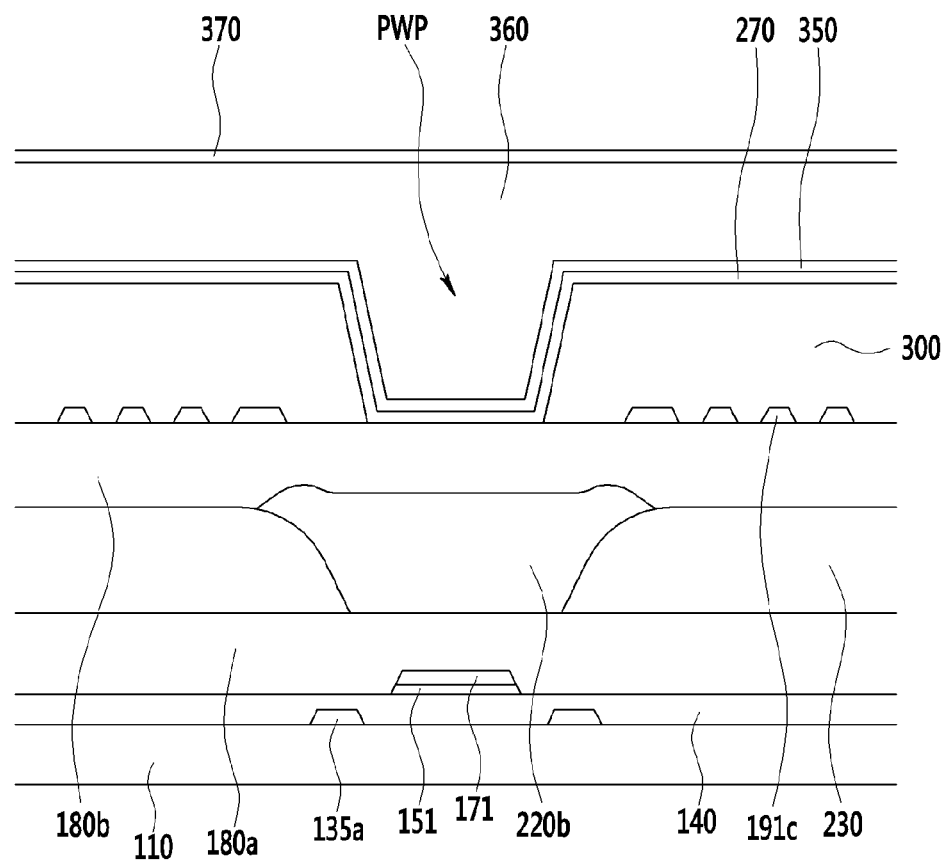

FIG. 10A to FIG. 16C are stepwise cross-sectional views and top plan views showing a manufacturing method of a liquid crystal display in accordance with an embodiment. FIGS. 10A, 12A, 13A, 14A, 15A, and 16A show stepwise cross-sectional views taken along line III-III of FIG. 2. FIGS. 10B, 12B, 13B, 15B, and 16B show stepwise cross-sectional views taken along line IV-IV of FIG. 2. FIGS. 10C, 12C, 13C, 15C, and 16C show stepwise cross-sectional views taken along line VII-VII of FIG. 1. FIGS. 12D, 13D, 14D, and 15D show stepwise cross-sectional views taken along line VIII-VIII of FIG. 1. FIG. 11 is a top plan view showing a step for forming a sacrificial layer.

Referring to FIG. 2, FIG. 10A, and FIG. 10B, in order to form a switching element on the substrate 110, the gate line 121 extending in a horizontal direction is formed, the gate insulating layer 140 is formed on the gate line 121, the semiconductor layers 151 and 154 are formed on the gate insulating layer 140, and the source electrode 173 and the drain electrode 175 are formed. The data line 171 connected with the source electrode 173 may be formed to cross the gate line 121 and extend in a vertical direction.

The first interlayer insulating layer 180a is formed on the data conductors 171, 173, and 175 including the source electrode 173, the drain electrode 175, and the data line 171 and the exposed portion of the semiconductor layer 154.

The color filters 230 are formed at a position corresponding to the pixel area on the first interlayer insulating layer 180a, and the light blocking members 220a and 220b are formed between the color filters 230. When the light blocking members 220a and 220b are formed, the light blocking layer 221 may also be formed together with them.

The second interlayer insulating layer 180b is formed to cover the color filter 230 and the light blocking members 220a and 220b, and the second interlayer insulating layer 180b is formed to have the contact hole 185 electrically and physically connecting the pixel electrode 191 and the drain electrode 175.

Thereafter, the pixel electrode 191 is formed on the second interlayer insulating layer 180b, and a sacrificial layer 300 is formed on the pixel electrode 191. As illustrated in FIG. 10B, an open portion OPN is formed in the sacrificial layer 300 in a direction parallel with the data line 171. In a subsequent process, the common electrode 270, the lower insulating layer 350, the roof layer 360, and the upper insulating layer 370 are filled in the open portion OPN to form the partition wall formation portion PWP.

Referring to FIG. 10C and FIG. 11, the sacrificial layer 300 is formed at a buffer region-reserved region 315R at which the buffer region 315 is to be formed. The sacrificial layer 300 may be formed of an organic material. A second width d2 of the buffer region-reserved region 315R may be formed more widely than a first width d1 of a trench-reserved region 307FPR on which the trench 307FP is to be formed.

Referring to FIG. 12A to FIG. 12D, the common electrode 270, the lower insulating layer 350, and the roof layer 360 are sequentially formed on the sacrificial layer 300. The roof layer 360 may be removed at the region corresponding to the horizontal light blocking member 220a disposed between the pixel areas adjacent in the vertical direction by an exposure and development process. The roof layer 360 exposes the lower insulating layer 350 in the region corresponding to the horizontal light blocking member 220a. As shown in FIG.

12B, the common electrode 270, the lower insulating layer 350, and the roof layer 360 fill the open portion OPN formed above the vertical light blocking member 220b thereby forming the partition forming portion (PWP).

As shown in FIG. 12C, the lower insulating layer 350 and the roof layer 360 may be formed in such a way so as to cover the sacrificial layer 300 provided in the buffer region-reserved region 315R formed to have the second width d2. Spaces between the sacrificial layers 300 located between the adjacent buffer region-reserved regions 315R may be covered with the roof layer 360.

As shown in FIG. 12D, the roof layer 360 may be removed at an air hole reserved region 330R on which the air hole 330 is to be formed. The lower insulating layer 350 located on the sacrificial layer 300 is exposed to the outside.

Referring to FIG. 13A to FIG. 13D, the upper insulating layer 370 is formed in such a way so as to cover upper portions of the roof layer 360 and the exposed lower insulating layer 350.

Figure 14A:
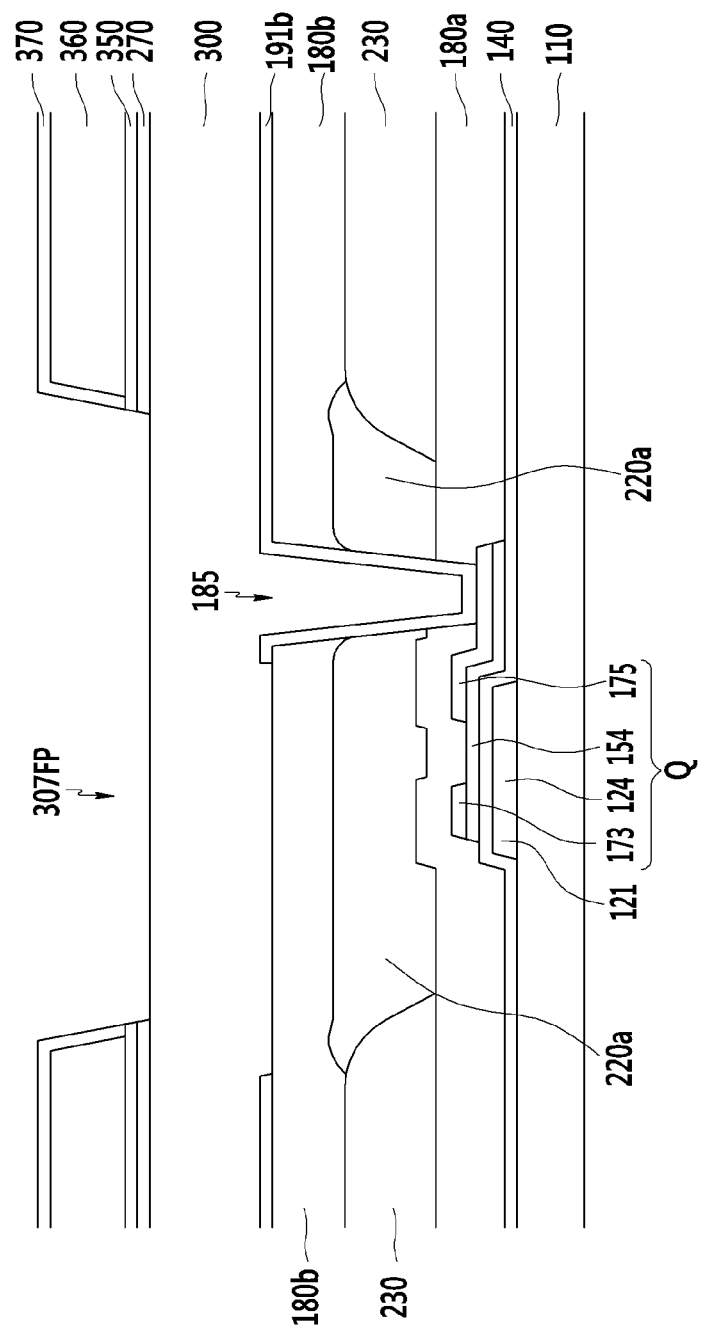
Figure 15A:
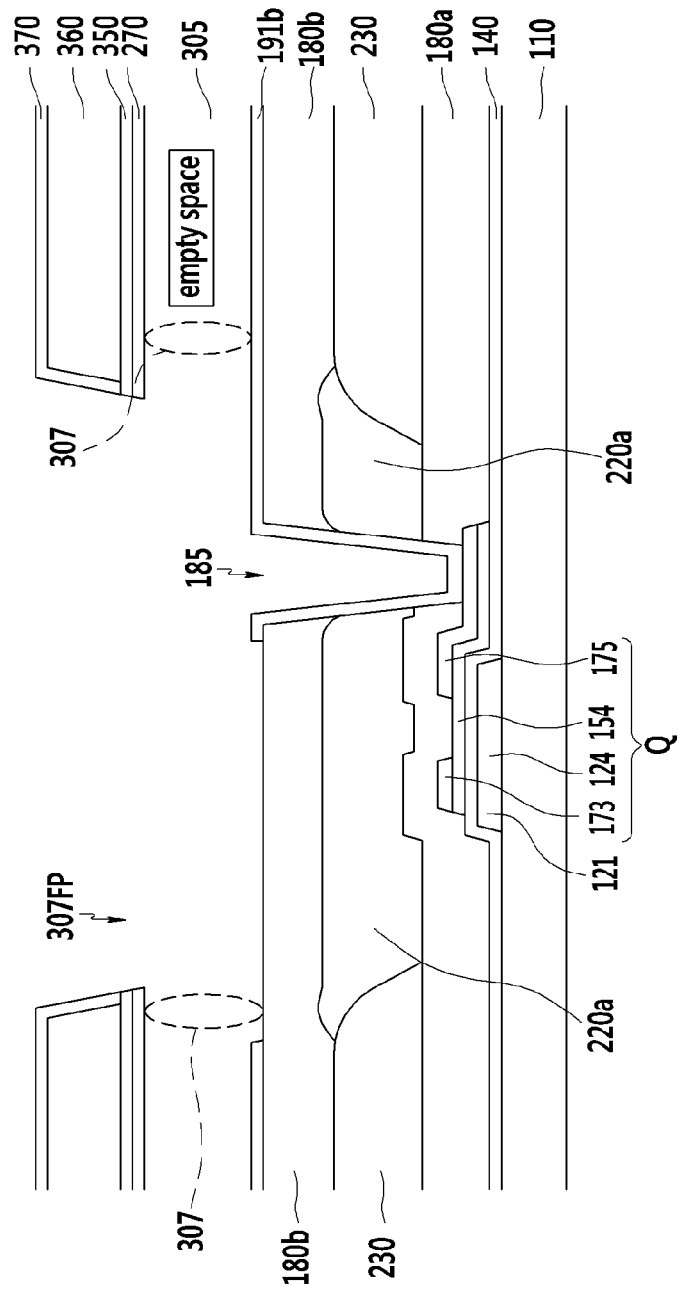
Figure 15B:
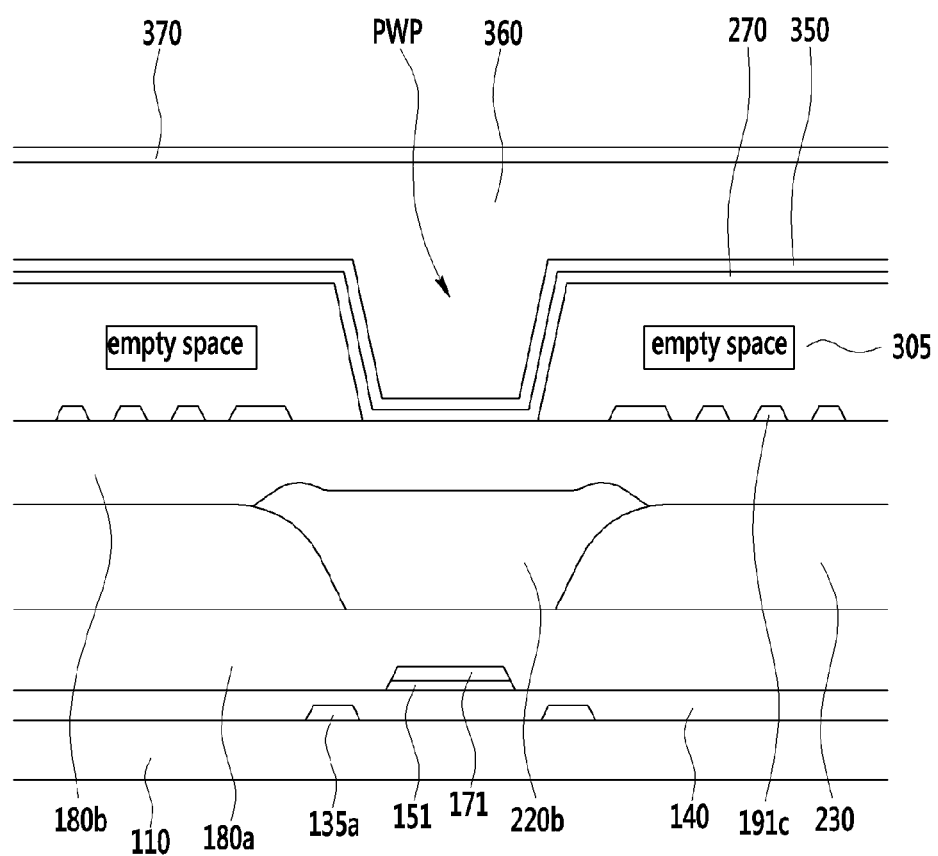

Referring to FIG. 14A and FIG. 14B, the upper insulating layer 370, the lower insulating layer 350, and the common electrode 270 are dry-etched to partially remove the upper insulating layer 370, the lower insulating layer 350, and the common electrode 270, thereby forming the trench 307FP and the air hole 330. The sacrificial layer 300 is exposed to the outside.

Referring to FIG. 15A to FIG. 15D, the sacrificial layer 300 is removed by an oxygen ($O_2$) ashing process or a wet-etching method through the trench 307FP and the air hole 330. The microcavity 305 having the liquid crystal injection hole 307 is formed in the display area DA, and the buffer region 315 is formed at an edge of the display area DA or the peripheral area PA. The microcavity 305 is in a state of an empty space according to the removal of the sacrificial layer 300.

Figure 16A:
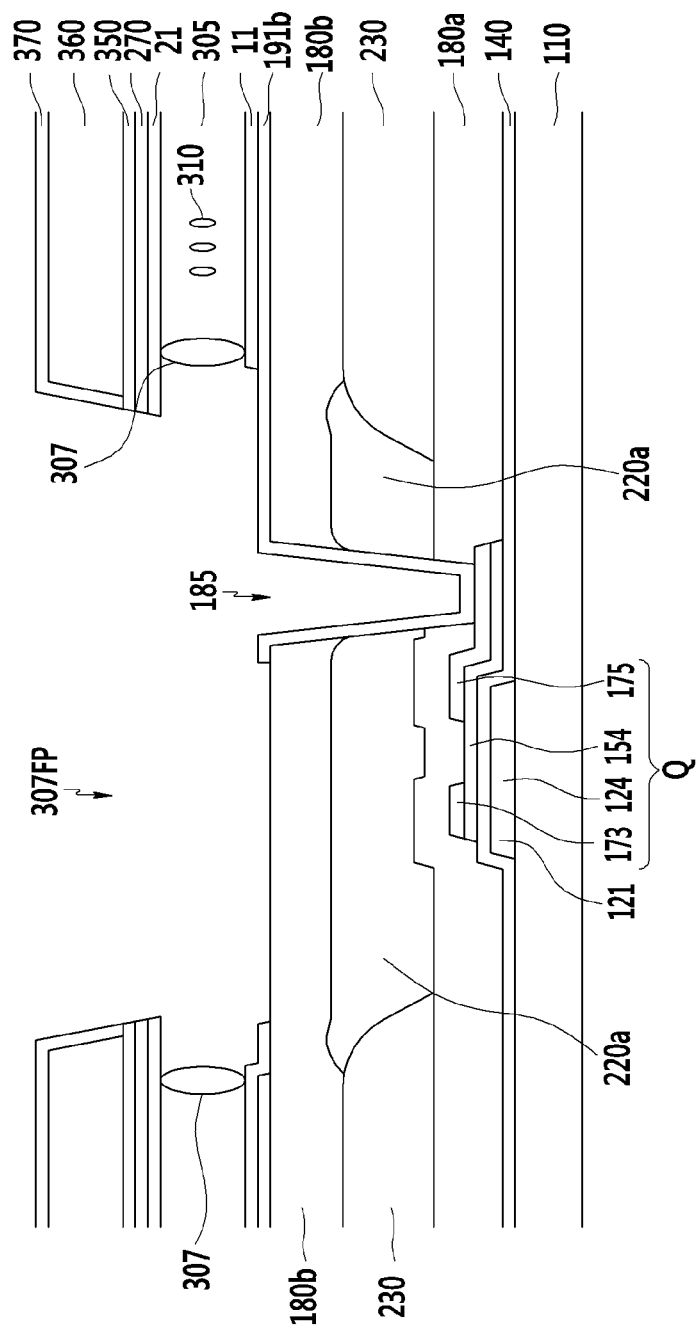
Figure 16B:
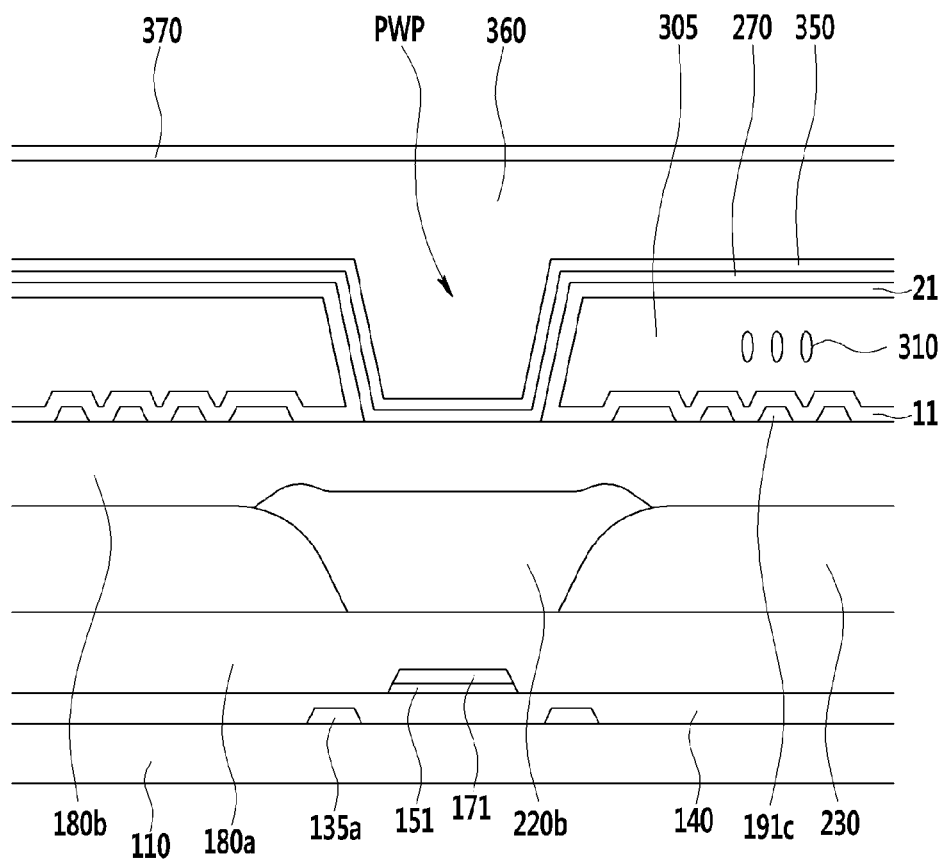
Figure 16C:
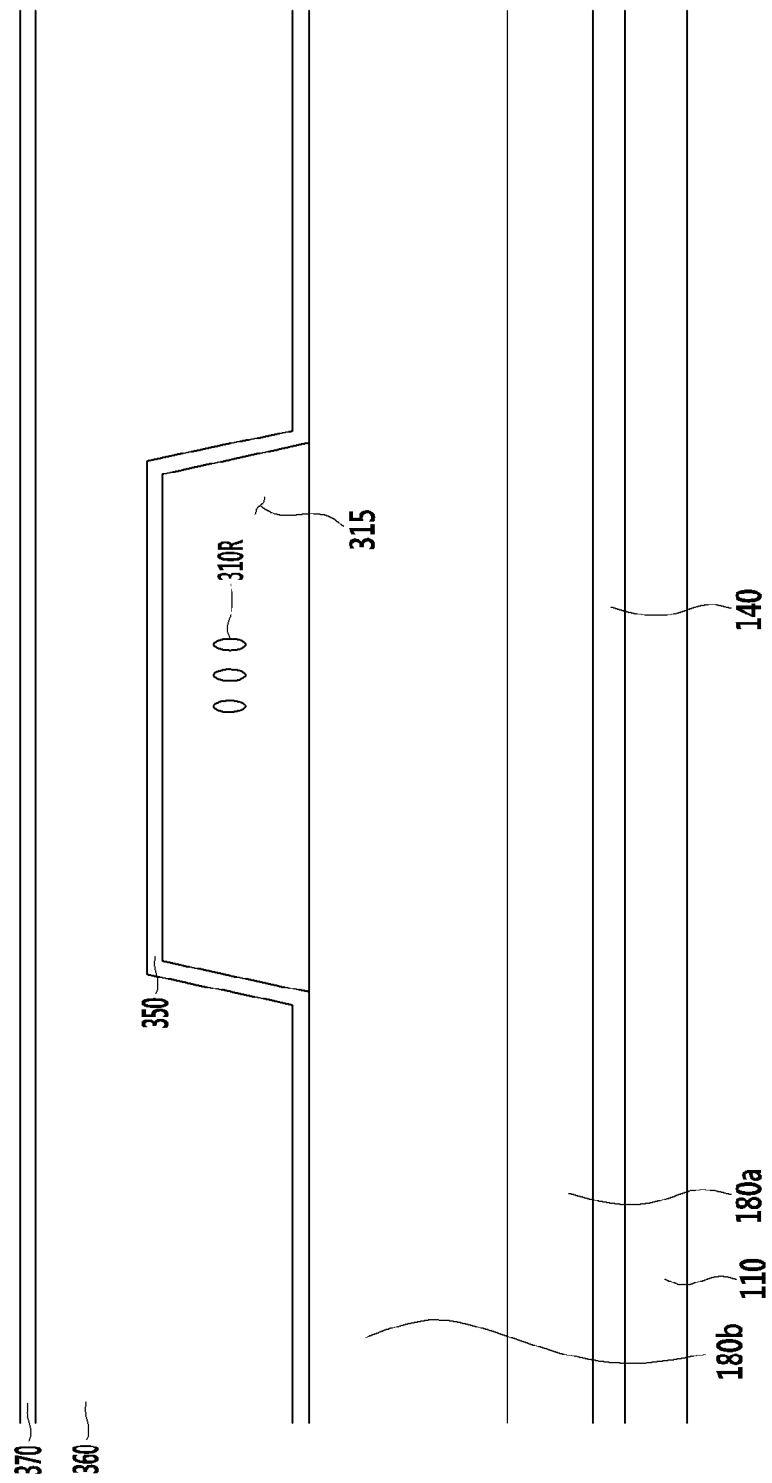

Referring to FIG. 16A to FIG. 16C, the alignment layers 11 and 21 are formed on the pixel electrode 191 and the common electrode 270 by injecting the aligning material through the liquid crystal injection hole 307 in the display area DA. A bake process is performed after injecting the aligning material including a solid and a solvent through the liquid crystal injection hole 307.

Next, a liquid crystal material containing the liquid crystal molecules 310 may be dripped along the trench 307FP by using an inkjet method or the like. The liquid crystal material dripped along the trench 307FP may be injected into the microcavity 305 through the liquid crystal injection hole 307 by a capillary force. The liquid crystal material may be dripped by using the buffer region 315 as a start point.

Thereafter, the capping layer 390 is formed on the upper insulating layer 370 to cover the liquid crystal injection hole 307 and the trench 307FP to form the liquid crystal display illustrated in FIG. 3 to FIG. 9.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
   a substrate;
   a thin film transistor disposed on the substrate;
   a pixel electrode disposed on the thin film transistor;
   a roof layer facing the pixel electrode;
   a plurality of microcavities disposed between the pixel electrode and the roof layer, each microcavity of the plurality of microcavities comprising liquid crystal materials;
   a capping layer covering a trench disposed between the microcavities; and
   a buffer region disposed at an end portion of the trench,
   wherein the buffer region is disposed at an edge of a display area including a plurality of pixels, and
   wherein the trench has a first width, the buffer region has a second width, and the second width is larger than the first width.

2. The liquid crystal display of claim 1, wherein the buffer region is covered with the roof layer.

3. The liquid crystal display of claim 2, further comprising a lower insulating layer and a common electrode disposed between each microcavity and the roof layer, wherein the lower insulating layer is disposed on the common electrode.

4. The liquid crystal display of claim 3, wherein the thin film transistor is connected to a data line, and a partition wall formation portion is disposed between the microcavities along an extending direction of the data line.

5. The liquid crystal display of claim 1, wherein at least a portion of liquid crystal materials are contained in the buffer region.

6. The liquid crystal display of claim 5, wherein an air hole is formed at the roof layer located above the buffer region.

7. The liquid crystal display of claim 6, wherein the capping layer is disposed above the roof layer, wherein the capping layer covers the air hole.

8. The liquid crystal display of claim 5, wherein the buffer region includes a plurality of buffer regions formed along one side of the display area, and each of the buffer regions are formed separately from one another.

9. The liquid crystal display of claim 8, wherein gaps between the buffer regions are covered with the roof layer.

10. A liquid crystal display comprising:
    a substrate;
    a thin film transistor disposed on the substrate;
    a pixel electrode disposed on the thin film transistor;
    a roof layer facing the pixel electrode;
    a plurality of microcavities formed between the pixel electrode and the roof layer, each microcavity of the plurality of microcavities comprising liquid crystal materials;
    a trench formed between the microcavities; and
    a buffer region formed at an end portion of the trench,
    wherein the buffer region includes a plurality of buffer regions formed along one side of a display area, and each of the buffer regions are disposed separately from one another, and
    wherein the trench has a first width, the buffer region has a second width, and the second width is larger than the first width.

* * * * *